US010074632B2

(12) United States Patent
Song et al.

(10) Patent No.: US 10,074,632 B2
(45) Date of Patent: Sep. 11, 2018

(54) SOLID-STATE DRIVE

(71) Applicant: SAMSUNG ELECTRONICS CO., LTD., Suwon-si, Gyeonggi-do (KR)

(72) Inventors: Sang-Sub Song, Suwon-si (KR); Sang-Ho Park, Hwaseong-si (KR); Ki-Hong Jeong, Jeongju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 15/147,922

(22) Filed: May 6, 2016

(65) Prior Publication Data
US 2017/0012023 A1   Jan. 12, 2017

(30) Foreign Application Priority Data

Jul. 8, 2015  (KR) .................. 10-2015-0097160

(51) Int. Cl.
  *H01L 25/065*  (2006.01)
  *H01L 23/00*  (2006.01)
  (Continued)

(52) U.S. Cl.
  CPC ...... *H01L 25/0657* (2013.01); *H01L 25/0655* (2013.01); *H01L 25/105* (2013.01); *H01L 23/3128* (2013.01); *H01L 24/16* (2013.01); *H01L 24/17* (2013.01); *H01L 24/32* (2013.01); *H01L 24/48* (2013.01); *H01L 24/73* (2013.01); *H01L 24/92* (2013.01); *H01L 25/18* (2013.01); *H01L 2224/16146* (2013.01); *H01L 2224/16227* (2013.01); *H01L 2224/17181* (2013.01); *H01L 2224/32145* (2013.01);
  (Continued)

(58) Field of Classification Search
  CPC ..... H01L 25/0657; H01L 24/06; H01L 24/45; H01L 24/13; H01L 2924/1434
  See application file for complete search history.

(56) References Cited

U.S. PATENT DOCUMENTS 5,991,185 A  11/1999  Hachiya
6,433,422 B1  8/2002  Yamasaki
(Continued)

FOREIGN PATENT DOCUMENTS

JP  2000-164627  6/2000

*Primary Examiner* — Peniel M Gumedzoe
(74) *Attorney, Agent, or Firm* — Volentine, Whitt & Francos, PLLC

(57) ABSTRACT

A solid-state drive (SSD) includes a main printed circuit board (PCB), and a first semiconductor package and a second semiconductor package respectively mounted on a top surface and a bottom surface of the main PCB. Each of the first and second semiconductor packages has a surface on which connection pads corresponding to a package ball map are disposed. The package ball map includes cells arranged in a plurality of rows and a plurality of columns, and one signal corresponds to each of the cells of the package ball map. The package ball map includes first signals corresponding to at least some of cells included in a selected reference column from among the plurality of columns, and at least one pair of second signals respectively corresponding to cells that are symmetrical to each other with respect to the reference column. The pair of second signals are swappable signals, and the first signals are not swappable signals.

15 Claims, 20 Drawing Sheets

(51) Int. Cl.
*H01L 25/10* (2006.01)
*H01L 23/31* (2006.01)
*H01L 25/18* (2006.01)

(52) U.S. Cl.
CPC ............... *H01L 2224/32225* (2013.01); *H01L 2224/48091* (2013.01); *H01L 2224/48145* (2013.01); *H01L 2224/48227* (2013.01); *H01L 2224/73204* (2013.01); *H01L 2224/73253* (2013.01); *H01L 2224/73265* (2013.01); *H01L 2224/92125* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06558* (2013.01); *H01L 2225/06562* (2013.01); *H01L 2225/06565* (2013.01); *H01L 2225/107* (2013.01); *H01L 2225/1023* (2013.01); *H01L 2225/1058* (2013.01); *H01L 2924/1434* (2013.01); *H01L 2924/15311* (2013.01)

(56) References Cited

U.S. PATENT DOCUMENTS

| | | | |
|---|---|---|---|
| 6,844,209 B2 | 1/2005 | Yamada et al. | |
| 6,911,732 B2 | 6/2005 | Muff et al. | |
| 8,331,161 B2 | 12/2012 | Noh | |
| 8,981,547 B2 | 3/2015 | Crisp et al. | |
| 2003/0089982 A1* | 5/2003 | Feurle | H05K 1/181 |
| | | | 257/734 |
| 2011/0057710 A1 | 3/2011 | Terayama | |
| 2011/0068482 A1 | 3/2011 | Akiyama | |
| 2013/0286707 A1* | 10/2013 | Crisp | H01L 24/24 |
| | | | 365/63 |

* cited by examiner

FIG. 1

|   | A | B | C | D | E | F | G |
|---|---|---|---|---|---|---|---|
| 9 |   |   |   | NS0 |   |   |   |
| 8 |   |   |   | NS1 |   |   |   |
| 7 |   |   |   | NS2 |   |   |   |
| 6 | MB1 | MB0 |   | MB0 |   | MB0 | MB1 |
| 5 | SA1-2 | SA2-2 | MB1 | NS3 | MB1 | SA2-1 | SA1-1 |
| 4 | SA3-2 | SA4-2 | MB0 | MB1 | MB0 | SA4-1 | SA3-1 |
| 3 | MB0 | MB1 |   | NS4 |   | MB1 | MB0 |
| 2 | MB1 |   |   | MB1 |   |   |   |
| 1 |   |   |   | NS5 |   |   | MS |

FIG. 2

| | A | B | C | D | E | F | G |
|---|---|---|---|---|---|---|---|
| 9 | | | | CLE | | | |
| 8 | | | | ALE | | | |
| 7 | | | | Vref | | | |
| 6 | VSSQ | VCCQ | | VCCQ | | VCCQ | VSSQ |
| 5 | DQ7/0 | DQ6/1 | VSSQ | DQS | VSSQ | DQ1/6 | DQ0/7 |
| 4 | DQ5/2 | DQ4/3 | VCCQ | VSSQ | VCCQ | DQ3/4 | DQ2/5 |
| 3 | VCCQ | VSSQ | | REB | | VSSQ | VCCQ |
| 2 | VSSQ | | | VCCQ | | | |
| 1 | | | | WEB | | | MS |

|   | A | B | C | D | E | F | G |
|---|---|---|---|---|---|---|---|
| 9 |   |   |   | CLE |   |   |   |
| 8 |   |   |   | ALE |   |   |   |
| 7 |   |   |   | Vref |   |   |   |
| 6 |   |   |   |   |   |   |   |
| 5 |   |   |   | DQS |   |   |   |
| 4 |   |   |   |   |   |   |   |
| 3 |   |   |   | REB |   |   |   |
| 2 |   |   |   |   |   |   |   |
| 1 |   |   |   | WEB |   |   | MS |

RC points to column D.

|   | A | B | C | D (RC) | E | F | G |
|---|---|---|---|---|---|---|---|
| 9 |   |   |   |   |   |   |   |
| 8 |   |   |   |   |   |   |   |
| 7 |   |   |   |   |   |   |   |
| 6 |   |   |   |   |   |   |   |
| 5 | DQ7/0 | DQ6/1 |   |   |   | DQ1/6 | DQ0/7 |
| 4 | DQ5/2 | DQ4/3 |   |   |   | DQ3/4 | DQ2/5 |
| 3 |   |   |   |   |   |   |   |
| 2 |   |   |   |   |   |   |   |
| 1 |   |   |   |   |   |   | MS |

|   | A | B | C | D (RC) | E | F | G |
|---|---|---|---|---|---|---|---|
| 9 | | | | | | | |
| 8 | | | | | | | |
| 7 | | | | | | | |
| 6 | VSSQ | VCCQ | | VCCQ | | VCCQ | VSSQ |
| 5 | | | VSSQ | | VSSQ | | |
| 4 | | | VCCQ | VSSQ | VCCQ | | |
| 3 | VCCQ | VSSQ | | | | VSSQ | VCCQ |
| 2 | VSSQ | | | VCCQ | | | |
| 1 | | | | | | | MS |

FIG. 6

|   | A | B | C | D | E | F | G |
|---|---|---|---|---|---|---|---|
| 9 | | | | CLE | | | |
| 8 | | | | ALE | | | |
| 7 | | | | Vref | | | |
| 6 | VSSQ | VCCQ | | VCCQ | | VCCQ | VSSQ |
| 5 | DQ7 | DQ6 | VSSQ | DQS | VSSQ | DQ1 | DQ0 |
| 4 | DQ5 | DQ4 | VCCQ | VSSQ | VCCQ | DQ3 | DQ2 |
| 3 | VCCQ | VSSQ | | REB | | VSSQ | VCCQ |
| 2 | VSSQ | | | VCCQ | | | |
| 1 | | | | WEB | | | MS |

FIG. 7

|   | A | B | C | D | E | F | G |
|---|---|---|---|---|---|---|---|
| 9 |   |   |   | CLE |   |   |   |
| 8 |   |   |   | ALE |   |   |   |
| 7 |   |   |   | Vref |   |   |   |
| 6 | VSSQ | VCCQ |   | VCCQ |   | VCCQ | VSSQ |
| 5 | DQ0 | DQ1 | VSSQ | DQS | VSSQ | DQ6 | DQ7 |
| 4 | DQ2 | DQ3 | VCCQ | VSSQ | VCCQ | DQ4 | DQ5 |
| 3 | VCCQ | VSSQ |   | REB |   | VSSQ | VCCQ |
| 2 | VSSQ |   |   | VCCQ |   |   |   |
| 1 |   |   |   | WEB |   |   | MS |

SOLID-STATE DRIVE

CROSS-REFERENCE TO RELATED APPLICATION

This application claims the benefit of Korean Patent Application No. 10-2015-0097160, filed on Jul. 8, 2015, in the Korean Intellectual Property Office, the disclosure of which is incorporated herein in its entirety by reference.

BACKGROUND

The inventive concept relates to a solid-state drive (SSD), and more particularly, to an SSD having semiconductor packages mounted to a top surface and a bottom surface of a main printed circuit board (PCB).

An SSD has attracted much attention as an advanced storage device capable of superseding a hard disk drive (HDD). The SSD, which is a storage device based on a non-volatile memory, may have low power consumption and a high storage density. Also, a computer system may be configured to be booted rapidly by using the SSD as a storage device of the computer system. Thus, the demand for SSDs is expected to greatly increase.

Furthermore, it is necessary to increase the reliability and operating speed of SSDs with an increase in performance of computer systems.

SUMMARY

The inventive concept provides a solid-state drive (SSD) capable of improving the reliability and the operating speed.

According to an aspect of the inventive concept, there is provided an SSD including a main printed circuit board (PCB), and a first semiconductor package and a second semiconductor package respectively mounted on a top surface and a bottom surface of the main PCB. Each of the first and second semiconductor packages has a surface on which connection pads corresponding to cells of a package ball map are disposed. The cells of the package ball map are arranged in a plurality of rows and a plurality of columns, and one signal corresponds to each of the cells of the package ball map. The package ball map includes first signals corresponding to at least some of cells included in a selected reference column from among the plurality of columns, and at least one pair of second signals respectively corresponding to cells that are symmetrical to each other with respect to the reference column. The pair of second signals are swappable signals, and the first signals are not swappable.

The first and second semiconductor packages may be respectively mounted on a top surface and a bottom surface of the main PCB such that first connection pads respectively corresponding to the first signals, from among the connection pads, are arranged in a first direction.

Second connection pads corresponding to the at least one pair of second signals, from among the connection pads, may be respectively disposed on surfaces of the first and second semiconductor packages and spaced apart from a straight line extending along the first connection pads.

The package ball map may further include a mode selection signal corresponding to one of cells included in a column other than the reference column from among the plurality of columns, and the mode selection signal may swap the pair of second signals with each other.

Each of the first and second semiconductor packages may include a third connection pad corresponding to the mode selection signal. The third connection pad may correspond to a surface of each of the first and second semiconductor packages and spaced apart from a straight line extending along the first connection pads.

The main PCB may include a first bottom pad, which corresponds to and is electrically connected to the third connection pad of the second semiconductor package. The first bottom pad may be electrically connected to one of a power signal or a ground signal.

The third connection pad of the first semiconductor package may be electrically insulated from the main PCB.

The main PCB may include a first top pad and a first bottom pad, which respectively correspond to and are electrically connected to third connection pads of the first and second semiconductor packages. A power signal may be electrically connected to one of the first top pad and the first bottom pad, and a ground signal may be electrically connected to the other of the first top pad and the first bottom pad.

The second signal may be a data signal.

The first and second semiconductor packages may provide a one-channel non-volatile memory interface.

According to another aspect of the inventive concept, there is provided an SSD including a main PCB, a first controller package and a first non-volatile memory package mounted on a top surface of the main PCB, and a second controller package and a second non-volatile memory package mounted on a bottom surface of the main PCB. Each of the first and second controller packages has a surface on which connection pads, which face each other across the main PCB and correspond to a package ball map, are disposed. The package ball map includes cells arranged in a plurality of rows and a plurality of columns, and one signal may be correspond to each of the cells of the package ball map. The package ball map includes first signals corresponding to at least some of cells included in a selected reference column from among the plurality of columns, and at least one pair of second signals respectively corresponding to cells that are symmetrical to each other with respect to the reference column. Here, the first signals are not swappable, and the at least one pair of second signals are swappable with each other.

The first and second controller packages may be respectively mounted on the top surface and the bottom surface of the main PCB such that, among the connection pads, first connection pads respectively corresponding to the first signals are arranged in a first direction. The first and second non-volatile memory packages may be spaced apart from the first controller package and the second controller package in the first direction and respectively mounted on the top surface and the bottom surface of the main PCB.

The first connection pads of the first semiconductor package may face the first connection pads of the second semiconductor package across the main PCB.

Second connection pads among the connection pads may correspond to the second signals. A pair of second signals of one of the first and second controller packages may be swappable with each other. Among the connection pads of each of the first and second controller packages, the same signal may be provided to second connection pads, which face each other across the main PCB.

Each of the first and second non-volatile memory packages may include a plurality of stacked non-volatile memory semiconductor chips.

BRIEF DESCRIPTION OF THE DRAWINGS

Exemplary embodiments of the inventive concept will be more clearly understood from the following detailed description taken in conjunction with the accompanying drawings in which:

FIG. 1 is a package ball map depicting the arrangement of some signals of a semiconductor package included in a solid-state drive (SSD) according to an exemplary embodiment;

FIG. 2 is a package ball map depicting the arrangement of some signals of a semiconductor package included in an SSD according to an exemplary embodiment;

FIGS. 3 to 5 are package ball maps depicting the arrangements of some signals of a semiconductor package included in an SSD according to an exemplary embodiment;

FIGS. 6 and 7 are package ball maps depicting the arrangements of some signals of a semiconductor package included in an SSD according to an exemplary embodiment;

DETAILED DESCRIPTION OF THE EMBODIMENTS

Figure 8:
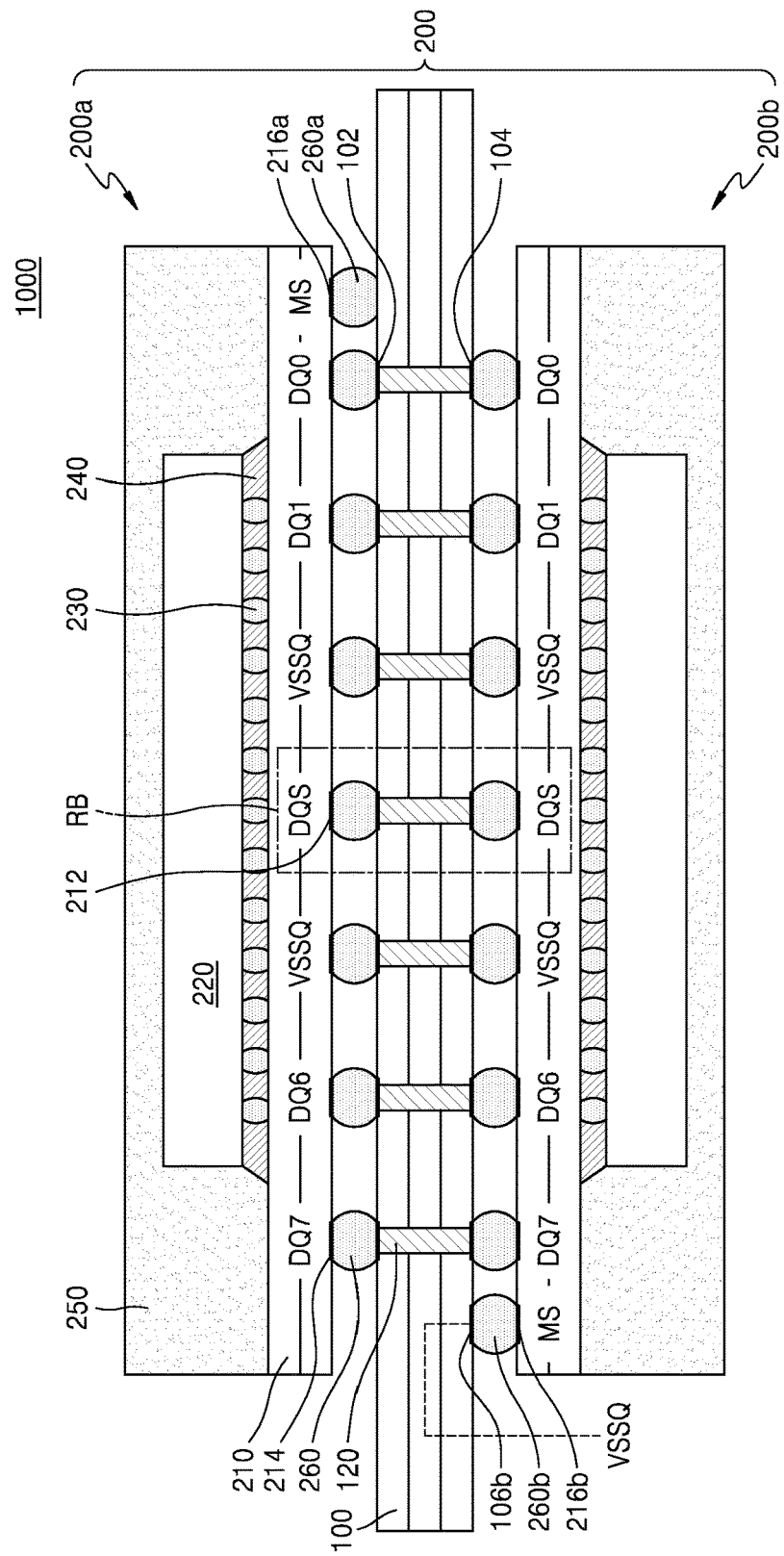
FIG. 8 is a cross-sectional view of main elements of an SSD according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions are exaggerated for clarity, and the relative sizes of respective elements may be exaggerated or reduced.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the inventive concept.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs.

Hereinafter, the inventive concept will be described in detail by explaining exemplary embodiments of the inventive concept with reference to the attached drawings.

FIG. 1 is a package ball map 10 depicting the arrangement of some signals of a semiconductor package included in a solid-state drive (SSD) according to an exemplary embodiment. The semiconductor package may be a semiconductor package including a controller chip for a non-volatile memory.

A package ball map may refer to a table in which signals input to and output from a semiconductor package are arranged such that one signal corresponds to each of cells of the package ball map. The semiconductor package may include input/output (I/O) connection pads corresponding to the package ball map. Signals may not correspond to some of the cells of the package ball map. Although the package ball map may be similar to the arrangement of the I/O connection pads in the semiconductor package, since the package ball map is a table depicting the arrangement of input/output signals, the package ball map may not precisely coincide with the arrangement of I/O connection pads actually formed on a surface of the semiconductor package. For example, the I/O connection pads of the semiconductor package for signals arranged in one row or one column of the package ball map may also be arranged in one row or one column, but the inventive concept is not limited thereto. For example, an interval between the I/O connection pads of the semiconductor package or positions of the I/O connection pads may be changed to some extent in consideration of interference between signals and power supply. In this case, the I/O connection pads of the semiconductor package may not form rows or columns for signals corresponding to some rows or some columns of the package ball map but may be dispersed and arranged. However, as a whole, two signals corresponding to relatively near cells may correspond to two connection pads disposed near to each other in the semiconductor package, and two signals corresponding to relatively far cells may correspond to two connection pads disposed far from each other in the semiconductor package.

Referring to FIG. 1, the package ball map 10 may include cells arranged in a plurality of rows 1 to 9 and a plurality of columns A to G. Although FIG. 1 illustrates a case in which the package ball map 10 includes nine rows 1 to 9 and seven columns A to G, the inventive concept is not limited thereto. For example, the number of rows and/or the number of columns in the package ball map may increase or decrease depending on the arrangement of signals in the semiconductor package indicated by the package ball map. Alternatively, the package ball map 10 shown in FIG. 1 may indicate signals corresponding to only some of all connection pads included in the semiconductor package.

One column D of the package ball map 10 may be selected as a reference column RC. A column arranged relatively in the middle among the plurality of columns A to G may be selected as the reference column RC. First signals NS may correspond to some cells of the reference column RC. For example, a plurality of first signals NS0 to NS5 may correspond to some cells 9-D, 8-D, 7-D, 5-D, 3-D, and 1-D of cells 1D to 9D included in the reference column RC. Each of the first signals NS0 to NS5 may be a non-swappable signal. The first signal NS may include, for example, a command latch enable (CLE) signal, an address latch enable (ALE) signal, a voltage reference (Vref) signal, a data strobe (DQS) signal, a read enable (REB) signal, and a write enable (WEB) signal. Also, the first signal NS is not limited thereto and may include a larger number of kinds of signals.

Herein, when a specific signal (e.g., a mode selection signal MS) is provided to a semiconductor package and cells to which different kinds of signals are corresponding may be swappable with each other in the package ball map 10, the swappable signal may refer to a relationship between two signals. The swappable signal will be described in detail later.

Second signals SA may correspond to some cells of the package ball map 10. Each of the second signals SA may be a signal including a swappable signal. The second signals SA may be, for example, I/O port (DQ) signals. For example, a pair of swappable second signals SA1-1 and SA1-2 may correspond to cells 5-G and 5-A, which are symmetrical to each other with respect to the reference column RC, and a pair of swappable second signals SA2-1 and SA2-2 may correspond to cells 5-F and 5-B, which are symmetrical to each other with respect to the reference column RC. Also, a pair of swappable second signals SA3-1 and SA3-2 may correspond to cells 4-G and 4-A, which are symmetrical to each other with respect to the reference column RC, and a pair of swappable second signals SA4-1 and SA4-2 may correspond to cells 4-F and 4-B, which are symmetrical to each other with respect to the reference column RC. When a specific signal (e.g., a mode selection signal MS) is provided to the semiconductor package, a pair of second signals SA1-1 and SA1-2 correspond to a pair of symmetrical cells (e.g., cells 5-G and 5-A) may be swappable with each other.

Third signals MB may correspond to some cells of the package ball map 10. A plurality of third signals MB may be connected in common. The third signals MB may include the same signals MB0 or MB1, which are connected in common and correspond to a plurality of cells of the package ball map 10. For example, the third signals MB may include I/O power (VCCQ) and I/O ground (VSSQ). Some of the third signals MB may correspond to some cells of the reference column RC. For example, some of the third signals MB may correspond to some cells 2-D, 4-D, and 6-D of cells 1D to 9D of the reference column RC. Also, some of the third signals MB may correspond to pairs of cells (3-G and 3-A, 3F and 3B, 4-E and 4-C, 5-E and 5-C, 6-G and 6-A, and 6-F and 6-B), which are symmetrical to each other with respect to the reference column RC. In this case, the third signal (one of MB0 and MB1) of the same kind may correspond to cells that are symmetrical to each other with respect to the reference column RC. Optionally, some of the third signals MB may independently correspond to only a cell 2-A included in a column other than the reference column RC, but not correspond to another cell 2-G that is symmetrical to the cell 2-A with respect to the reference column RC.

When the third signals MB include two kinds of signals, namely, power signals and ground signals, the number of cells to which one kind of signals (e.g., third signals MB0) are corresponding may be equal to the number of cells to which the other kind of signals (e.g., third signals MB1) are corresponding.

A mode selection signal MS for swapping a pair of second signals SA with each other may correspond to one cell 1-G of cells included in columns other than the reference column RC. For example, when a power signal or a ground signal is electrically connected to the mode selection signal MS, a pair of second signals SA may be swappable with each other. When the mode selection signal MS is electrically floated, the pair of second signals SA may not be swappable with each other. Alternatively, for example, when the power signal is electrically connected to the mode selection signal MS, the pair of second signals SA may be swappable with each other. When the ground signal is electrically connected to the mode selection signal MS, the pair of second signals SA may not be swappable with each other. Alternatively, for example, when the ground signal is electrically connected to the mode selection signal MS, the pair of second signals SA may be swappable with each other. When the power signal is electrically connected to the mode selection signal MS, the pair of second signals SA may not be swappable with each other.

As described later, when two homogeneous semiconductor packages, each of which has a surface on which connection pads corresponding to the package ball map 10 are disposed, are mounted on a PCB such that the connection pads face each other across the PCB, different signals may be connected to the connection pads of each of the two semiconductor packages, which may correspond to the mode selection signal MS. In this case, signals of the same kind may be provided to the connection pads of each of the two semiconductor packages, which may face each other and correspond to one second signal SA. Thus, the design of a circuit interconnection may be simplified in the PCB.

Although not shown, a signal, which is used at a low frequency of use from among non-swappable signals, may correspond to one of cells included in columns other than the reference column RC. That is, for example, when the non-swappable signals are provided in a relatively large number and cannot all correspond to the cells included in the reference column RC, a signal that is used at a high frequency of use or a signal that is continuously used during an operation may correspond to the cell included in the reference column RC, while a signal that is used at a low frequency of use may correspond to one of cells included in columns other than the reference column RC. Herein, an expression "first signal" may refer to only a signal corresponding to a cell, which forms the reference column RC, from among the non-swappable signals.

FIG. 2 shows a package ball map 20 depicting the arrangement of some signals of a semiconductor package included in an SSD according to an exemplary embodiment. The package ball map 20 shown in FIG. 2 may be an example of arrangement of specific signals in the package ball map 10 shown in FIG. 1. Thus, the same descriptions as in FIG. 1 may be omitted from the descriptions of FIG. 2.

Referring to FIGS. 1 and 2, the package ball map 20 may include cells included in a plurality of rows 1 to 9 and a plurality of columns A to G. One column D of the package ball map 20 may be selected as a reference column RC. A first signal NS that is a non-swappable signal may correspond to some cells of the reference column RC. For example, a CLE signal may correspond to a cell 9-D, an ALE signal may correspond to a cell 8-D, a Vref signal may correspond to a cell 7-D, a DQS signal may correspond to a cell 5-D, an REB signal may correspond to a cell 3-D, and a WEB signal may correspond to a cell 1-D.

For reference, a plurality of CLE signals (e.g., CLE1 and CLE2), a plurality of ALE signals (e.g., ALE1 and ALE2), a plurality of Vref signals (e.g., Vref1 and Vref2), a plurality of DQS signals (e.g., DQS1 and DQS2), a plurality of REB signals (e.g., REB1 and REB2), or a plurality of WEB signals (e.g., WEB1 and WEB2) may be arranged, but these signals may not be swappable with one another but operate independent of one another.

A second signal SA may correspond to some cells of the package ball map 20. The second signal SA may be a signal including a swappable signal. For example, when the second signal SA is an I/O port signal for 8-bit data, a signal DQ0 and a signal DQ7 may correspond to a cell 5-G and a cell 5-A, a signal DQ1 and a signal DQ6 may correspond to a cell 5-F and a cell 5-B, a signal DQ2 and a signal DQ5 may correspond to a cell 4-G and a cell 4-A, and a signal DQ3 and a signal DQ4 may correspond to a cell 4-F and a cell 4-B.

In FIG. 2, DQ0/7 indicates that the signal DQ0 or the signal DQ7 corresponds to response to a mode selection signal MS. That is, the signal DQ0 and the signal DQ7 respectively correspond to the cell 5-G and the cell 5-A or the signal DQ7 and the signal DQ0 respectively corresponds to the cell 5-G and the cell 5-A in response to the mode selection signal MS. The signals DQ0 to DQ7 may be signals I/O port-bit 0 to I/O port-bit 7. When the second signals SA are I/O port signals having bits 0 to 7, the sum of bits of a pair of swappable second signals SA may be 7, which is the maximum number of bits of the second signal SA. Thus, the signals DQ0 to DQ7 or the signals DQ7 to DQ0 may correspond to cells to which the second signals SA correspond, in response to the mode selection signal MS.

Although not shown, for example, when the second signals SA are I/O port signals for 16-bit data, the second signals SA may include I/O port signals having bits 0 to 15. In this case, in response to the mode selection signal MS, signals DQ0 to DQ15 may correspond to cells to which the second signal SA corresponds, or signals DQ15 to DQ0 may correspond to the cells to which the second signal SA correspond. Alternatively, in response to the mode selection signal MS, signals DQ0 to DQ7 and signals DQ8 to DQ15 may correspond to the cells to which the second signal SA corresponds, or signals DQ7 to DQ0 and signals DQ15 to DQ8 may correspond to the cells to which the second signal SA is corresponds. That is, the second signal SA may swap I/O port signals indicating 16 bits with one unit or swap each of I/O port signals indicating 8 bits (bits 0 to 7 and bits 8 to 15) with one unit. The swapping of the second signals SA may be performed by a multiplexer circuit included in the semiconductor package to which the mode selection signal MS is applied.

Third signals MB may correspond to some cells of the package ball map 20. A plurality of third signals MB may be connected in common. For example, the third signals MB may include power signals VCCQ and ground signals VSSQ. That is, the power signals VCCQ may correspond to a plurality of cells of some cells of the package ball map 20, and the ground signals VSSQ may correspond to a plurality of other cells thereof. The power signals VCCQ corresponding to the plurality of cells and the ground signals VSSQ corresponding to the plurality of cells may be electrically connected in common. For example, pads of a PCB to which connection pads of a semiconductor package corresponding to the power signals VCCQ are respectively electrically connected may be electrically connected in common Thus, the connection pads of the semiconductor package corresponding to the power signals VCCQ may also be electrically connected in common. Similarly, pads of a PCB to which connection pads of a semiconductor package corresponding to the ground signals VSSQ are respectively electrically connected may be electrically connected in common Thus, the connection pads of the semiconductor package corresponding to the power signals VSSQ may also be electrically connected in common.

A plurality of power signals VCCQ or a plurality of ground signals VSSQ that may be connected in common may correspond to the package ball map 20 and arranged relatively freely. For example, some signals (underlined VCCQ) of the power signals VCCQ may correspond to some cells (e.g., 2-D and 6-D) included in the reference column RC. Also, some of the power signals VCCQ may correspond to pairs of cells (e.g., a pair of cells 3-G and 3-A, a pair of cells 4-E and 4-C, and a pair of cells 6-F and 6-B), which are symmetrical to each other with respect to the reference column RC. For example, some signals (underlined VSSQ) of the ground signals VSSQ may correspond to some cells (e.g., the cell 4-D) included in the reference column RC. Also, some of the power signals VSSQ may correspond to pairs of cells (e.g., a pair of cells 3-F and 3-B, a pair of cells 5-E and 5-C, and a pair of cells 6-G and 6-A) that are symmetrical to each other with respect to the reference column RC.

When two semiconductor packages having connection pads corresponding to the package ball map 20 are provided such that the connection pads of the semiconductor packages face each other, connection pads corresponding to the same signal, from among the power signals VCCQ and the ground signals VSSQ, correspond to some cells of the reference column RC or cells that are symmetrical to each other with respect to the reference column RC. That is, connection pads corresponding to the power signal VCCQ may face each other, and connection pads corresponding to the ground signal VSSQ may face each other.

Optionally, some signals (italic VSSQ) of the third signals MB may independently correspond only to the cell 2-A included in a column other than the reference column RC but not correspond to another cell 2-G that is symmetrical to the cell 2-A with respect to the reference column RC.

When the third signals MB include two kinds of signals, namely, power signals VCCQ and ground signals VSSQ, the number of cells in which the power signals VCCQ correspond to the package ball map 20 may be equal to the number of cells in which the ground signals VSSQ correspond to the package ball map 20. For example, when the number (e.g., 2) of cells to which the power signals VCCQ correspond, from among cells of the reference column RC, is different from the number (e.g., 1) of cells to which the ground signal VSSQ corresponds, from among the cells of the reference column RC, fewer third signals (e.g., ground signals VSSQ) may correspond to cells included in columns other than the reference column RC. Thus, in the package ball map 20, the number of cells to which the power signals VCCQ correspond may be equal to the number of cells to which the ground signals VSSQ correspond.

Accordingly, the number of some third signals MB independently corresponding to cells included in columns other than the reference column RC may be smaller than the number of all the third signals MB.

A mode selection signal MS for swapping a pair of second signals SA with each other may correspond to one cell 1-G of cells included in a column other than the reference column RC. For example, a power signal VCCQ or a ground signal VSSQ may be electrically connected to the mode selection signal MS.

The connection pads of the semiconductor package corresponding to a plurality of power signals VCCQ or a plurality of ground signals VSSQ may be directly electrically connected in the semiconductor package. However, the connection pad of the semiconductor package corresponding to the mode selection signal MS may not be directly electrically connected to the connection pad of the semiconductor package corresponding to the power signal VCCQ or the ground signal VSSQ in the semiconductor package. However, the pad of the PCB to which the connection pad of the semiconductor package corresponding to the mode selection signal MS is electrically connected may be directly electrically connected to the pad of the PCB to which the connection pad of the semiconductor package corresponding to the power signal VCCQ or the ground signal VSSQ is electrically connected, in a circuit interconnection of the PCB.

FIGS. 3 to 5 are package ball maps depicting the arrangements of some signals of a semiconductor package included in an SSD according to an exemplary embodiment. Specifically, FIGS. 3 to 5 are package ball maps in which the first to third signals NS, SA, and MB shown in FIG. 2 are divided from one another. Thus, the same descriptions as in FIG. 2 may be omitted from the descriptions of FIGS. 3 to 5.

Referring to FIGS. 1 and 3, one column D of a package ball map 20-1 may be selected as a reference column RC. First signals NS that are non-swappable signals may correspond to some cells of the reference column RC. For example, a CLE signal may correspond to a cell 9-D, an ALE signal may correspond to a cell 8-D, a Vref signal may correspond to a cell 7-D, a DQS signal may correspond to a cell 5-D, an REB signal may correspond to a cell 3-D, and a WEB signal may correspond to a cell 1-D.

When two homogeneous semiconductor packages, each of which has a surface on which connection pads corresponding to the package ball map 20-1 are disposed, are mounted on a PCB such that the connection pads face each other across the PCB, the connection pads corresponding to the first signals NS may be arranged in the same direction opposite to each other. In this case, signals of the same kind may be provided to the connection pads of each of the two semiconductor packages, which may face each other and correspond to the first signals NS. Accordingly, the design of a circuit interconnection may be simplified in the PCB.

Referring to FIGS. 1 and 4, second signals SA may correspond to some of cells of a package ball map 20-2, which are symmetrical to each other with respect to a reference column RC. The second signals SA may be signals having swappable signals. For example, when the second signal SA is an I/O port signal for 8-bit data, signals DQ0 and DQ7 may correspond to a cell 5-G and a cell 5-A, signals DQ1 and DQ6 may correspond to a cell 5-F and a cell 5-B, signals DQ2 and DQ5 may correspond to a cell 4-G and a cell 4-A, and signals DQ3 and DQ4 may correspond to a cell 4-F and a cell 4-B.

For example, in response to a mode selection signal MS, the signals DQ0 and DQ7 may respectively correspond to the cell 5-G and the cell 5-A or the signals DQ7 and DQ0 may respectively correspond to the cell 5-G and the cell 5-A. Also, in response to the mode selection signal MS, the signals DQ1 and DQ6 may respectively correspond to the cell 5-F and the cell 5-B or the signals DQ6 and DQ1 may respectively correspond to the cell 5-F and the cell 5-B. Furthermore, in response to the mode selection signal MS, the signals DQ2 and DQ5 may respectively correspond to the cell 4-G and the cell 4-A or the signals DQ5 and DQ2 may respectively correspond to the cell 4-G and the cell 4-A. Similarly, in response to the mode selection signal MS, the signals DQ3 and DQ4 may respectively correspond to the cell 4-F and the cell 4-B or the signals DQ4 and DQ3 may respectively correspond to the cell 4-F and the cell 4-B.

Accordingly, when two homogeneous semiconductor packages, each of which has a surface on which connection pads corresponding to the package ball map 20-2 are disposed, are mounted on a PCB such that the connection pads face each other across the PCB, the connection pads corresponding to signals corresponding to the reference column RC may be arranged in the same direction opposite to each other. In this case, when a pair of second signals SA are swappable with each other in response to the mode selection signal MS in only one of the two semiconductor packages, signals of the same kind may be provided to the connection pads of each of the two semiconductor packages, which may face each other and correspond to the second signals SA. Accordingly, the design of a circuit interconnection may be simplified in the PCB.

Referring to FIGS. 1 and 5, third signals MB may correspond to some cells of a package ball map 20-3. For example, the third signals MB may include two kinds of signals, that is, power signals VCCQ and ground signals VSSQ.

Some of the power signals VCCQ or the ground signals VSSQ may correspond to some cells of the reference column RC. Also, some of the power signals VCCQ or the ground signals VSSQ may all correspond to cells that are symmetrical to each other with respect to the reference column RC. Optionally, some of the power signals VCCQ or the ground signals VSSQ may independently correspond to cells included in a column other than the reference column RC.

That is, the third signals MB may have similar disposition characteristics to the first signals NS, the second signals SA, and the mode selection signal MS according to positions to which the third signals MB correspond. Accordingly, descriptions of some of the third signals MB may be omitted from descriptions of disposition of the first signals NS, the second signals SA, and the mode selection signal MS.

In this case, the number of signals of the power signals VCCQ or the ground signals VSSQ, which independently correspond to cells included in columns other than in the reference column RC, may be smaller than the number of all the power signals VCCQ or all the ground signals VSSQ.

Accordingly, when two homogeneous semiconductor packages, each of which has a surface on which connection pads corresponding to the package ball map 20-3 are disposed, are mounted on a PCB such that the connection pads face each other across the PCB, the connection pads corresponding to signals corresponding to the reference column RC may be arranged in the same direction opposite to each other. In this case, signals of the same kind may be provided to connection pads of each of the two semiconductor packages, which face each other and correspond to the third signal MB. Also, since the number of connection pads corresponding to the third signals MB independently corresponding to the package ball map 20-3 is relatively small, a relatively large number of connection pads may face each other from among the connection pads of each of the two semiconductor packages, which may correspond to the third signals MB. Accordingly, the design of a circuit interconnection may be simplified in a PCB.

FIGS. 6 and 7 are package ball maps depicting the arrangement of some signals of a semiconductor package included in an SSD according to an exemplary embodiment. Specifically, the package ball maps 20a and 20b shown in FIGS. 6 and 7 may be examples of the package ball map 20 shown in FIG. 2, in which specific signals correspond to a response to a mode selection signal MS. Thus, the same descriptions as in FIGS. 2 to 5 may be omitted from the descriptions of FIGS. 6 and 7.

Referring to FIGS. 6 and 7, the package ball map 20a (hereinafter, a first package ball map 20a) shown in FIG. 6 and the package ball map 20b (hereinafter, a second package ball map 20b) shown in FIG. 7 show the disposition of specific signals when different mode selection signals MS are provided. For reference, the mode selection signal MS of the second package ball map 20b may be underlined unlike the mode selection signal MS of the first package ball map 20a to indicate that the mode selection signal MS of the first package ball map 20a is different from the mode selection signal MS of the second package ball map 20b.

For example, when a ground signal is provided to the mode selection signal MS of the first package ball map 20a, a power signal may be provided to the mode selection signal MS of the second package ball map 20b. In contrast, when a power signal is provided to the mode selection signal MS of the first package ball map 20a, a ground signal may be provided to the mode selection signal MS of the second package ball map 20b. Alternatively, when a power signal or a ground signal is provided to the mode selection signal MS of the first package ball map 20a, the mode selection signal MS of the second package ball map 20b may be electrically floated. Alternatively, when a power signal or a ground signal is provided to the mode selection signal MS of the second package ball map 20b, the mode selection signal MS of the first package ball map 20a may be electrically floated.

A signal DQ0 may correspond to the cell 5-G of the first package ball map 20a, and a signal DQ7 may correspond to the cell 5-G of the second package ball map 20b. Also, the signal DQ7 may correspond to the cell 5-A of the first package ball map 20a, and the signal DQ0 may correspond to the cell 5-A of the second package ball map 20b. That is, a pair of second signals DQ0 and DQ7 correspond to a pair of cells (i.e., the cell 5-G and the cell 5-A) that are symmetrical to each other with respect to the reference column RC may be swappable with each other in response to the mode selection signal MS.

Similarly, a pair of second signals DQ1 and DQ6 respectively corresponding to cells 5-F and 5-B may be swappable with each other in response to the mode selection signal MS, a pair of second signals DQ2 and DQ5 respectively corresponding to cells 4-G and 4-A may be swappable with each other in response to the mode selection signal MS, and a pair of second signals DQ3 and DQ4 may be swappable with each other in response to the mode selection signal MS.

Accordingly, when two homogeneous semiconductor packages, each of which has a surface on which connection pads are disposed, are mounted on a PCB such that the connection pads face each other across the PCB, the connection pads corresponding to signals corresponding to the reference column RC may be arranged in the same direction opposite to each other. In this case, when some signals (e.g., signals DQ0 to DQ7) of one semiconductor package are swappable with one another in response to the mode selection signal MS, the connection pads of each of the two semiconductor packages, which may correspond to the signals DQ0 to DQ7, may face each other. Accordingly, the design of a circuit interconnection may be simplified in the PCB.

FIG. 8 is a cross-sectional view of main elements of an SSD 1000 according to an exemplary embodiment.

Referring to FIG. 8, the SSD 1000 may include a main PCB 100 and a semiconductor package 200 mounted on the main PCB 100. The semiconductor package 200 may include a first semiconductor package 200a and a second semiconductor package 200b.

The SSD 1000 may further include a connector (not shown) configured to connect the SSD 1000 with a host and/or a housing (not shown) configured to protect the main PCB 100 and the semiconductor package 200.

The first and second semiconductor packages 200a and 200b may be homogeneous semiconductor packages, each of which has a surface on which connection pads 212, 214, and 216a/216b, each of which corresponds to the package ball map 20 shown in FIG. 2, are disposed. The connection pads 212, 214, and 216a/216b may include a first connection pad 212, a second connection pad 214, and a third connection pad 216a/b. The first connection pad 212, the second connection pad 214, and the third connection pad 216a/b may respectively refer to connection pads corresponding to a first signal NS, a second signal SA, and a mode selection signal MS described with reference to FIGS. 1 and 2. In FIG. 8, the third connection pad 216a/b is denoted by a different reference numeral from the third connection pad 216a of the first semiconductor package 200a and the third connection pad 216b of the second semiconductor package 200b for brevity. However, when the first and second semiconductor packages 200a and 200b are homogeneous semiconductor packages, the third connection pad 216a of the first semiconductor package 200a may be substantially the same element as the third connection pad 216b of the second semiconductor package 200b.

Herein, homogeneous semiconductor packages refer to semiconductor packages of substantially the same kind, which are mass-produced by using the same semiconductor process, or compatible semiconductor packages, which are produced by using different semiconductor processes to implement the same function. Accordingly, since the first semiconductor package 200a includes the same elements as the second semiconductor package 200b, unless clearly mentioned otherwise, descriptions of elements of the first semiconductor package 200a may be also applied to elements of the second semiconductor package 200b.

The first semiconductor package 200a and the second semiconductor package 200b may be respectively mounted on a top surface and a bottom surface of the main PCB 100 such that the connection pads 212, 214, and 216a of the first semiconductor package 200a face the connection pads 212, 214, and 216b of the second semiconductor package 200b.

The main PCB 100 may include a substrate base and a top pad 102 and bottom pads 104 and 106b respectively formed on a top surface and a bottom surface of the substrate base. Each of the top pad 102 and the bottom pads 104 and 106b may be exposed by a solder resist layer (not shown) covering the top surface and the bottom surface of the substrate base. The substrate base may be formed of at least one material selected from a phenol resin, an epoxy resin, and polyimide. For example, the substrate base may include at least one material selected from the group including Frame Retardant 4 (FR4), tetrafunctional epoxy, polyphenylene ether, epoxy/polyphenylene oxide, bismaleimide triazine (BT), Thermount, cyanate ester, polyimide, and a liquid crystal polymer. The top pad 102 and the bottom pads 104 and 106b may include copper, nickel, stainless steel, or beryllium copper. Internal interconnections 120 may be formed in the substrate base and electrically connected to the top pad 102 and the bottom pads 104 and 106b. Circuit interconnections may be formed by coating the top surface and the bottom surface of the substrate base with copper foil and patterning the copper foil, and the top pad 102 and the bottom pads 104 and 106b may be portions of the circuit interconnections, which are respectively exposed by the solder resist layer. The substrate base may include a plurality of base layers, and the main PCB 100 may include a layer, which includes circuit interconnections formed on the top surface and the bottom surface of the substrate base and between the respective base layers. That is, the main PCB 100 may include a plurality of layers. Although FIG. 8 illustrates only the internal interconnections 120 formed through the main PCB 100, the inventive concept is not limited thereto. Internal interconnections of the main PCB 100 may include circuit interconnections formed in the plurality of layers of the main PCB 100 and connection interconnections configured to connect the plurality of layers.

The first semiconductor package 200a may include a first package substrate 210 and a controller chip 220 mounted on the first package substrate 210. The first package substrate 210 may be, for example, a PCB. When the first package substrate 210 is the PCB, the first package substrate 210 may include a substrate base and a top pad (not shown) and connection pads 212, 214, and 216, which are respectively formed on a top surface and a bottom surface of the substrate base. Since the first package substrate 210 has a basic configuration similar to that of the main PCB 100, repeated descriptions are omitted.

The controller chip 220 may provide a flash interface for a non-volatile memory. The controller chip 220 may provide an interface and a protocol between a host and the non-volatile memory. The controller chip 220 may provide a standard protocol (e.g., peripheral component interconnect express (PCIe), serial attached-SCSI (SAS), or serial advanced technology attachment (SATA)) between the non-volatile memory and the host. Also, the controller chip 220 may perform a wear levelling operation, a garbage collection operation, a bad block management operation, and an error correction code (ECC) operation for the non-volatile memory.

The controller chip 220 may be electrically connected to the first package substrate 210 through a first connection bump 230. Optionally, an under-fill material layer 240 may be disposed between the controller chip 220 and the first package substrate 210 and surround the first connection bump 230.

The first semiconductor package 200a may further include a first mold layer 250 formed on a top surface of the first package substrate 210. The first mold layer 250 may be formed on the top surface of the first package substrate 210 to cover the controller chip 220. The first mold layer 250 may be formed of a resin. The first mold layer 150 may include, for example, an epoxy mold compound (EMC).

The first semiconductor package 200a may be electrically connected to the main PCB 100 through a first connection member 260. The first connection member 260 may be, for example, a solder ball or a bump. A bottom end of the first connection member 260 may be connected to the top pad 102 of the main PCB 100, and a top end of the first connection member 260 may be connected to the first and second connection pads 212 and 214 of the first semiconductor package 200a.

A second connection member 260a may be provided between the first semiconductor package 200a and the main PCB 100. A top end of the second connection member 260a may be connected to the third connection pad 216 of the first semiconductor package 200a. Although a bottom end of the second connection member 260a may be in contact with the top surface of the main PCB 100, the bottom end of the second connection member 260a may not be electrically connected to the main PCB 100.

The second semiconductor package 200b may be electrically connected to the main PCB 100 through the first connection member 260. The top end of the first connection member 260 may be connected to a first bottom pad 104 of the main PCB 100, and the bottom end of the first connection member 260 may be connected to the first and second connection pads 212 and 214 of the second semiconductor package 200b.

A third connection member 260b may be provided between the second semiconductor package 200b and the main PCB 100. A bottom end of the third connection member 260b may be connected to the third connection pad 216b of the second semiconductor package 200b. A top end of the third connection member 260b may be connected to the second bottom pad 106b of the main PCB 100.

Although the first to third connection members 260, 260a, and 260b may be connection members of substantially the same kind, the first to third connection members 260, 260a, and 260b may be different from one another in terms of an electrical connection relationship between each of the first to third connection members 260, 260a, and 260b and the main PCB 100. That is, the first connection member 260 may electrically connect the first and second semiconductor packages 200a and 200b with the main PCB 100, and the third connection member 260b may electrically connect the second semiconductor package 200b with the main PCB 100. However, the second connection member 260a may not electrically connect the first semiconductor package 200a with the main PCB 100. The electrical connection of the first to third connection members 260, 260a, and 260b with the main PCB 100 will be described in detail later.

FIG. 8 shows a cross-section of the first and second semiconductor packages 200a and 200b, which are vertical to a reference region RB in which first connection pads 212 corresponding to the first signals (refer to NS in FIG. 1) corresponding to the reference column RC of FIG. 2 are arranged. However, the first to third connection pads 212, 214, and 216a/216b and the first to third connection members 260, 260a, and 260b shown in FIG. 8 may not be arranged in a cross-section that forms the same plane surface. For example, the first and second connection pads 212 and 214 and the first connection member 260 may be arranged in a cross-section that forms a different plane surface from the third connection pad 216a/216b and the second and third connection members 260a and 260b.

The third connection pad 216a of the first semiconductor chip 200a to which the mode selection signal MS is corresponding may be connected to the second connection member 260a. However, the second connection member 260a may be in contact with the main PCB 100, the second connection member 260a may not be connected to the top pad 102 of the main PCB 100. Accordingly, the third connection pad 216a of the first semiconductor chip 200a may be electrically insulated from the main PCB 100. That is, the third connection pad 216a of the first semiconductor chip 200a to which the mode selection signal MS is corresponding may be electrically floated.

In contrast, the third connection pad 216b of the second semiconductor chip 200b to which the mode selection signal MS is corresponding may be connected to the third connection member 260b, and the third connection member 260b may be connected to the second bottom pad 106b of the main PCB 100. The second bottom pad 106b may be electrically connected to a ground signal VSSQ. That is, the ground signal VSSQ may be electrically connected to the third connection pad 216b of the second semiconductor chip 200b to which the mode selection signal MS is corresponding.

The first and second semiconductor packages 200a and 200b may be respectively mounted on a top surface and a bottom surface of the main PCB 100 such that the first connection pads 212 are arranged in the same direction. Also, the first and second semiconductor packages 200a and 200b may be respectively mounted on the top surface and the bottom surface of the main PCB 100 such that the first connection pads 212 face each other across the main PCB 100.

In the first and second semiconductor packages 200a and 200b, connection pads corresponding to signals corresponding to cells that are symmetrical to each other with respect to first signals (refer to NS in FIG. 1) corresponding to the reference column RC of FIG. 2 may face each other.

In this case, the third connection pad 216a of the first semiconductor chip 200a to which the mode selection signal MS is corresponding may be electrically floated, and the ground signal VSSQ may be electrically connected to the third connection pad 216b of the second semiconductor chip 200b. Thus, the first semiconductor package 200a may include connection pads on which signals are corresponding in the same manner as in the package ball map 20a shown in FIG. 6. The second semiconductor package 200b may include connection pads on which signals are corresponding in the same manner as in the package ball map 20b shown in FIG. 7.

Accordingly, in most cases, since signals of the same kind are provided on opposite connection pads of each of the first and second semiconductor packages 200a and 200b, the design of a circuit interconnection may be simplified in the main PCB 100.

Naturally, referring to the descriptions of FIGS. 1 to 7, signals of the same kind may not be provided on some opposite connection pads of each of the first and second semiconductor packages 200a and 200b. However, from among the opposite connection pads of each of the first and second semiconductor packages 200a and 200b, connection pads to which the signals of the same kind are provided may take a larger percentage than connection pads to which the signals of the same kind are not provided. Thus, the design of a circuit interconnection in the main PCB 100 may be simplified.

However, since it is unnecessary to provide signals of the same kind on the third connection pads 216a and 216b of the first and second semiconductor packages 200a and 200b corresponding to the mode selection signal MS, the third connection pads 216a and 216b may not be formed opposite each other but formed apart from each other.

The first and second semiconductor packages 200a and 200b, which may form an SSD 1000, may provide a one-channel non-volatile memory interface. In this case, opposite connection pads (e.g., the first and second connection pads 212 and 214), on which signals of the same kind are provided in each of the first and second semiconductor packages 200a and 200b, may be electrically connected by the internal interconnections 120 in the main PCB 100. That is, at least some of the signals of the same kind may be connected in common in each of the first and second semiconductor packages 200a and 200b.

Figure 9:
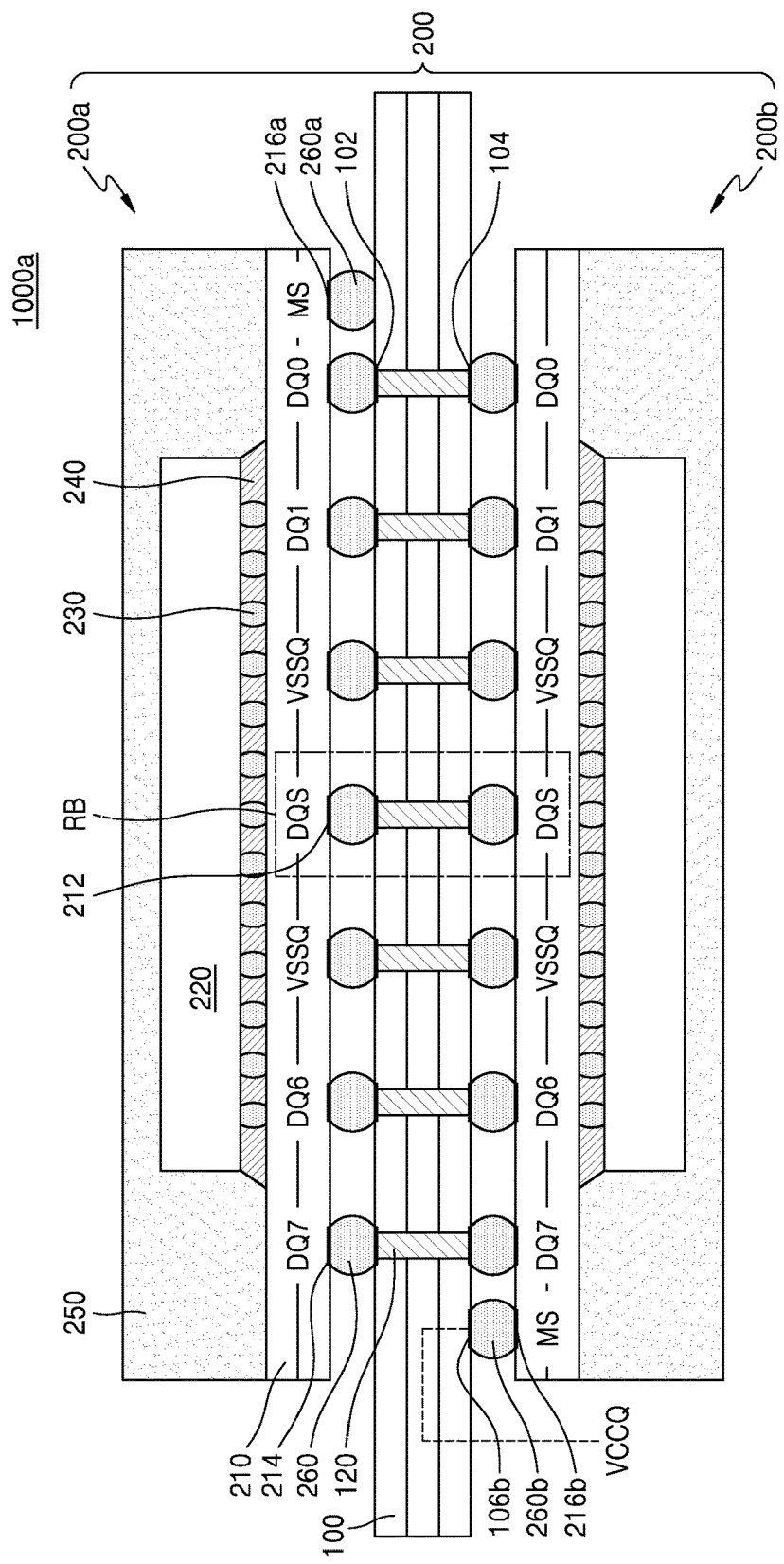
FIG. 9 is a cross-sectional view of main elements of an SSD according to an exemplary embodiment.

FIG. 9 is a cross-sectional view of main elements of an SSD 1000a according to an exemplary embodiment. The same descriptions as in FIG. 8 may be omitted from the descriptions of FIG. 9.

Referring to FIG. 9, the SSD 1000a may include a main PCB 100 and a semiconductor package 200 mounted on the main PCB 100. The semiconductor package 200 may include a first semiconductor package 200a and a second semiconductor package 200b.

The first and second semiconductor packages 200a and 200b may be homogeneous semiconductor packages, each of which has a surface on which connection pads 212, 214, and 216a/216b, each of which corresponds to the package ball map 20 shown in FIG. 2, are disposed. The connection pads 212, 214, and 216a/216b may include a first connection pad 212, second connection pad 214, and a third connection pad 216a/b.

The third connection pad 216a of the first semiconductor chip 200a to which a mode selection signal MS is corresponding may be connected to a second connection member 260a. However, although the second connection member 260a may be in contact with the main PCB 100, the second connection member 260a may not be connected to a top pad 102 of the main PCB 100. Accordingly, the third connection pad 216a of the first semiconductor chip 200a may be electrically insulated from the main PCB 100. That is, the third connection pad 216a of the first semiconductor chip 200a to which the mode selection signal MS is corresponding may be electrically floated.

In contrast, the third connection pad 216b of the second semiconductor chip 200b to which the mode selection signal MS is corresponding may be connected to a third connection member 260b, and the third connection member 260b may be connected to a second bottom pad 106b of the main PCB 100. The second bottom pad 106b may be electrically connected to a power signal VCCQ. That is, the power signal VCCQ may be electrically connected to the third connection pad 216b of the second semiconductor chip 200b to which the mode selection signal MS is corresponding.

The third connection pad 216a of the first semiconductor chip 200a to which the mode selection signal MS is corresponding may be electrically floated, and the power signal VCCQ may be electrically connected to the third connection pad 216b of the second semiconductor chip 200b. Thus, the first semiconductor package 200a may have connection pads on which signals are corresponding in the same manner as in the package ball map 20a shown in FIG. 6. The second semiconductor package 200b may have connection pads on which signals are corresponding in the same manner as in the package ball map 20b shown in FIG. 7 due to the swapping of signals.

Accordingly, in most cases, since signals of the same kind are provided on opposite connection pads of each of the first and second semiconductor packages 200a and 200b, the design of a circuit interconnection may be simplified in the main PCB 100.

Figure 10:
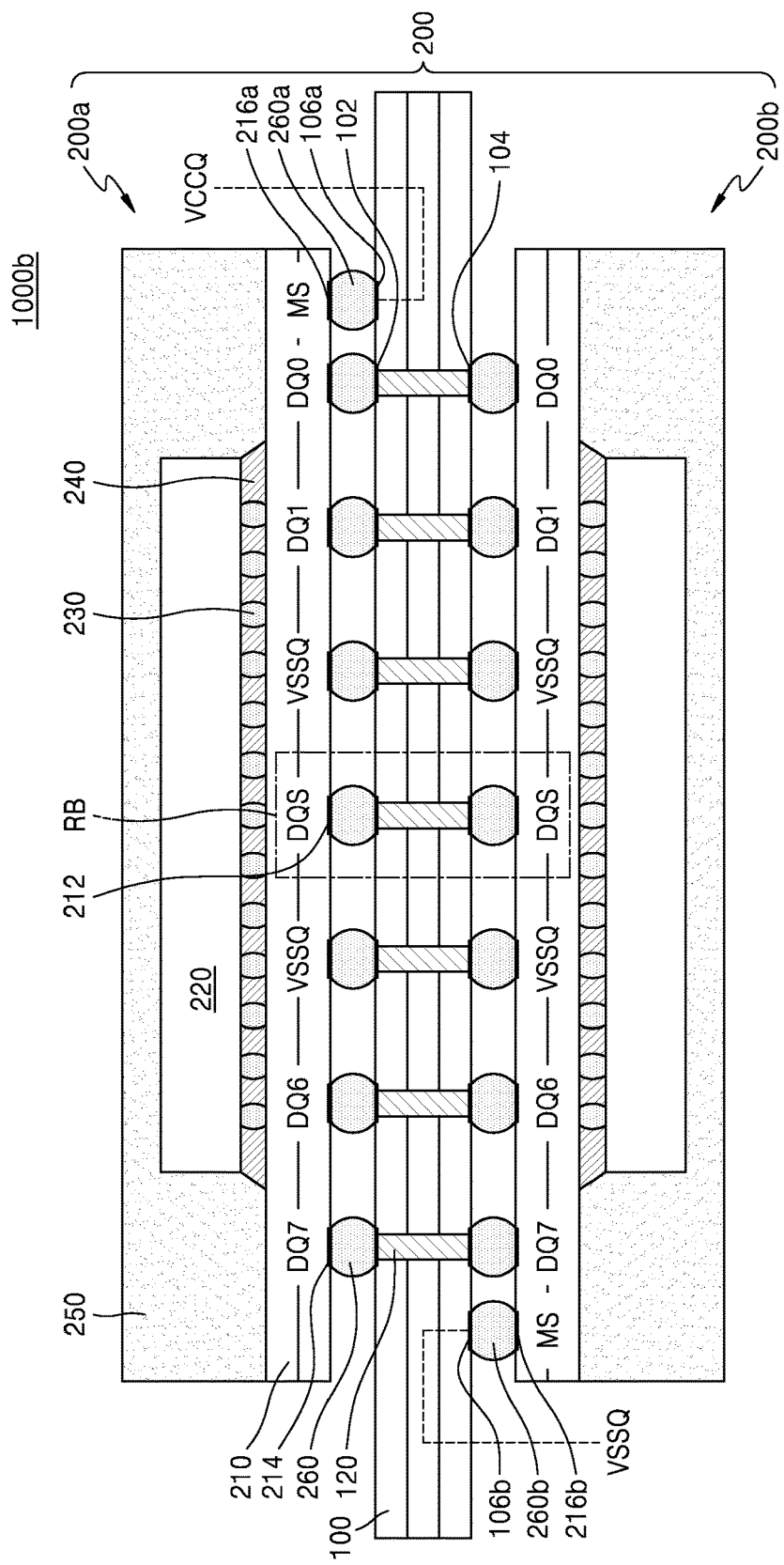
FIG. 10 is a cross-sectional view of main elements of an SSD according to an exemplary embodiment.

FIG. 10 is a cross-sectional view of main elements of an SSD 1000b according to an exemplary embodiment. The same descriptions as in FIG. 8 may be omitted from the descriptions of FIG. 10.

Referring to FIG. 10, the SSD 1000b may include a main PCB 100 and a semiconductor package 200 mounted on the main PCB 100. The semiconductor package 200 may include a first semiconductor package 200a and a second semiconductor package 200b.

The main PCB 100 may include a substrate base and top pads 102 and 106a and bottom pads 104 and 106b respectively formed on a top surface and a bottom surface of the substrate base.

The first and second semiconductor packages 200a and 200b may be homogeneous semiconductor packages, each of which has a surface on which connection pads 212, 214, and 216a/216b, each of which corresponds to the package ball map 20 shown in FIG. 2, are disposed. The connection pads 212, 214, and 216a/216b may include a first connection pad 212, a second connection pad 214, and a third connection pad 216a/b.

The third connection pad 216a of the first semiconductor chip 200a to which a mode selection signal MS is corresponding may be connected to the second connection member 260a. The second connection member 260a may be connected to the second bottom pad 106a of the main PCB 100. The second top pad 106a may be electrically connected to a power signal VCCQ. That is, the power signal VCCQ may be electrically connected to the third connection pad 216a of the first semiconductor chip 200a to which the mode selection signal MS is corresponding.

In contrast, a third connection pad 216b of the second semiconductor chip 200b to which the mode selection signal MS is corresponding may be connected to a third connection member 260b, and the third connection member 260b may be connected to a second bottom pad 106b of the main PCB 100. The second bottom pad 106b may be electrically connected to a ground signal VSSQ. That is, the ground signal VSSQ may be electrically connected to the third connection pad 216b of the second semiconductor chip 200b to which the mode selection signal MS is corresponding.

The power signal VCCQ may be electrically connected to the third connection pad 216a of the first semiconductor chip 200a to which the mode selection signal MS is corresponding, and the ground signal VSSQ may be electrically connected to the third connection pad 216b of the second semiconductor chip 200b. Thus, the first semiconductor package 200a may have connection pads on which signals are corresponding in the same manner as in the package ball map 20a shown in FIG. 6. The second semiconductor package 200b may have connection pads on which signals are corresponding in the same manner as in the package ball map 20b shown in FIG. 7 due to the swapping of signals.

Accordingly, in most cases, since signals of the same kind are provided on opposite connection pads of each of the first and second semiconductor packages 200a and 200b, the design of a circuit interconnection may be simplified in the main PCB 100.

Figure 11:
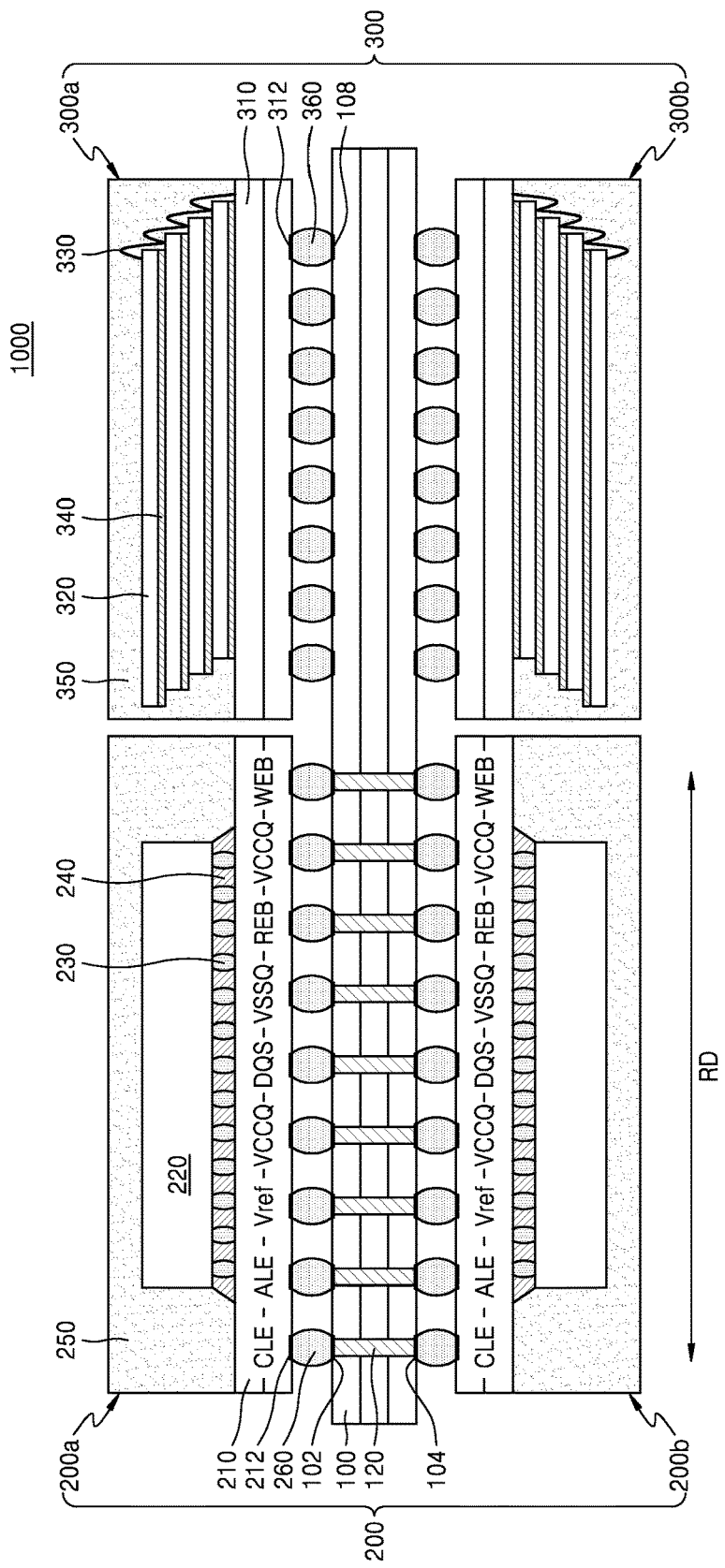
FIG. 11 is a cross-sectional view of main elements of an SSD according to an exemplary embodiment.

FIG. 11 is a cross-sectional view of main elements of the SSD 1000 according to an exemplary embodiment. The same descriptions as in FIG. 8 may be omitted from the descriptions of FIG. 11.

Referring to FIG. 11, the SSD 1000 may include a main PCB 100 and a semiconductor package 200 and a non-volatile memory package 300, which are mounted on the main PCB 100. The semiconductor package 200 may include a first semiconductor package 200a and a second semiconductor package 200b. Since each of the first semiconductor package 200a and the second semiconductor package 200b includes a controller chip 220, the first semiconductor package 200a and the second semiconductor package 200b may be referred to as a first controller package 200a and a second controller package 200b, respectively. The non-volatile memory package 300 may include a first non-volatile memory package 300a and a second non-volatile memory package 300b. The controller chip 220 included in each of the first semiconductor package 200a and the second semiconductor package 200b may control a non-volatile memory semiconductor chip 320 included in each of the first non-volatile memory package 300a and the second non-volatile memory package 300b.

The first controller package 200a and the second controller package 200b may be respectively mounted on a top surface and a bottom surface of the main PCB 100 such that connection pads 212 of the first controller package 200a face connection pads 212 of the second controller package 200b. The first non-volatile memory package 300a and the second non-volatile memory package 300b may be respectively mounted on a top surface and a bottom surface of the main PCB 100 such that connection pads 312 of the first non-volatile memory package 300a face connection pads 312 of the second non-volatile memory package 300b. The first and second non-volatile memory packages 300a and 300b may be electrically connected to the main PCB 100 through a fourth connection member 360 connected to the connection pad 312. The first connection member 260 may be, for example, a solder ball or a bump. The first and second non-volatile memory packages 300a and 300b may be respectively electrically connected to the first and second controller packages 200a and 200b through the main PCB 100.

The first and second controller packages 200a and 200b may be respectively mounted on the top surface and the bottom surface of the main PCB 100 such that the connection pads 212 corresponding to first signals NS described with reference to FIGS. 1 and 2 are arranged in the same direction (i.e., a first direction RD). The first and second controller packages 200a and 200b may be respectively mounted on the top surface and the bottom surface of the main PCB 100 such that the first connection pads 212 are arranged in the same direction.

The first and second non-volatile memory packages 300a and 300b may be spaced a first direction RD apart from the first controller package 200a and the second controller package 200b and respectively mounted on the top surface and the bottom surface of the main PCB 100. Since the first non-volatile memory package 300a includes the same elements as the second non-volatile memory package 300b, unless clearly mentioned otherwise, descriptions of elements of the first non-volatile memory package 300a may be also applied to elements of the second non-volatile memory package 300b.

The first non-volatile memory package 300a may include a second package substrate 310 and a non-volatile memory semiconductor chip 320 mounted on the second package substrate 310. The second package substrate 310 may be, for example, a PCB. When the second package substrate 310 is the PCB, the second package substrate 310 may include a substrate base and a top pad (not shown) and a connection pad 312, which are respectively formed on a top surface and a bottom surface of the substrate base. Since the second package substrate 310 has a similar basic configuration to that of the main PCB 100, repeated descriptions thereof are omitted.

The non-volatile memory semiconductor chip 320 may be, for example, a NAND flash memory, resistive random access memory (RRAM), magnetoresistive RAM (MRAM), phase-change RAM (PRAM), or ferroelectric RAM (FRAM).

The first non-volatile memory package 300a may include a plurality of non-volatile memory semiconductor chips 320, which are stacked on a second package substrate 310. The plurality of non-volatile memory semiconductor chips 320 may be stacked in a staircase form on the second package substrate 310 by a first die-attach film (DAF) 340. The plurality of non-volatile memory semiconductor chips 320 may be electrically connected to the second package substrate 310 through a first bonding wire 330. The first non-volatile memory package 300 may further include a second mold layer 350 formed on a top surface of the second package substrate 310. The second mold layer 350 may be formed on the top surface of the second package substrate 310 to cover the non-volatile memory semiconductor chip 320.

The design of a circuit interconnection in the main PCB 100 included in the SSD 1000 may be simplified. Accordingly, reliability and operating speed of the SSD 1000 may be improved, and the manufacturing cost of the SSD 1000 may be reduced.

The cross-sectional view of the SSD 1000 shown in FIG. 11 may also be applied to the SSDs 1000a and 1000b shown in FIGS. 9 and 10.

Figure 12:
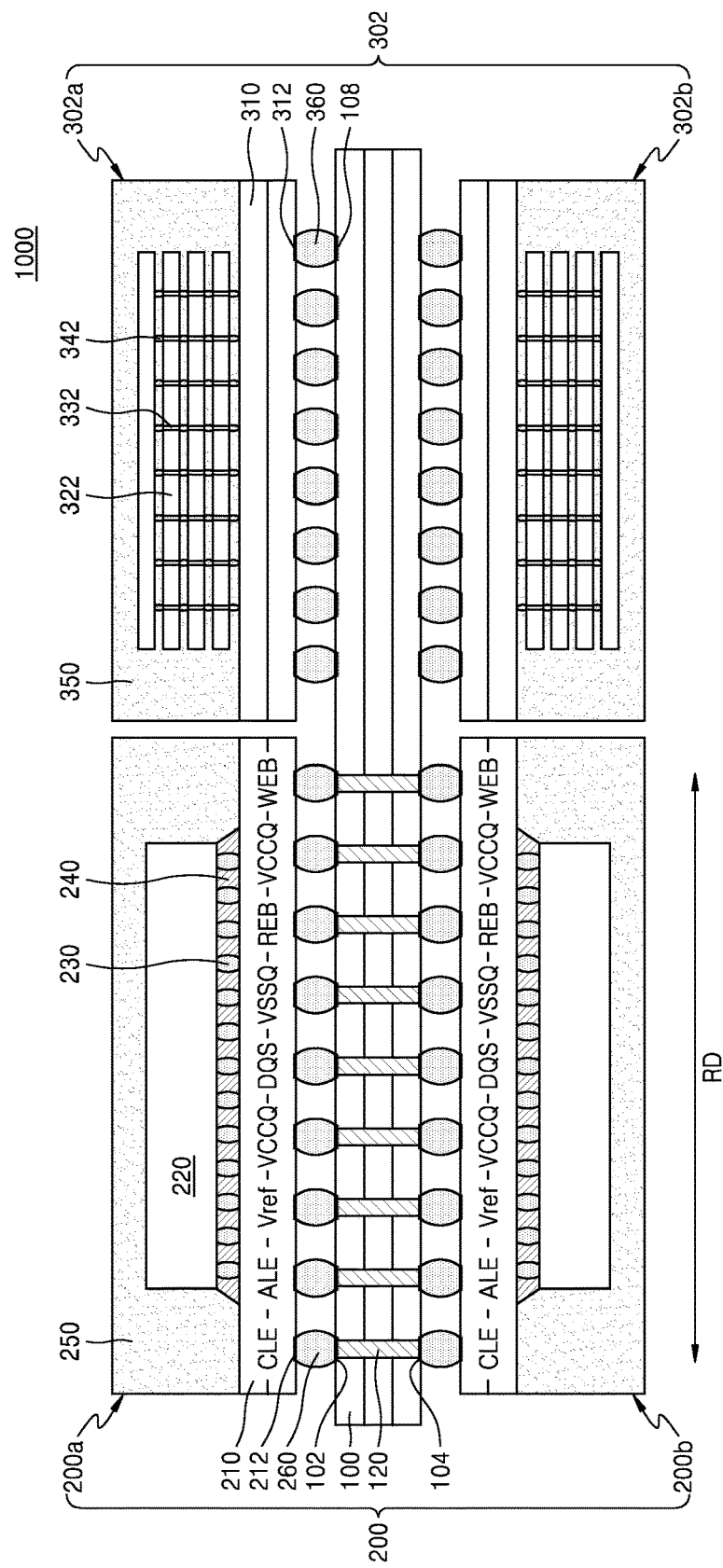
FIG. 12 is a cross-sectional view of main elements of an SSD according to an exemplary embodiment.

FIG. 12 is a cross-sectional view of main elements of an SSD 1000 according to an exemplary embodiment. The same descriptions as in FIG. 11 may be omitted from the descriptions of FIG. 12.

Referring to FIG. 12, the SSD 1000 may include a main PCB 100 and a semiconductor package 200 and a non-volatile memory package 302, which are mounted on the main PCB 100. The semiconductor package 200 may include a first controller package 200a and a second controller package 200b. The non-volatile memory package 302 may include a first non-volatile memory package 302a and a second non-volatile memory package 302b.

Since the first non-volatile memory package 302a includes the same elements as the second non-volatile memory package 302b, unless clearly mentioned otherwise, descriptions of elements of the first non-volatile memory package 302a may also be applied to elements of the second non-volatile memory package 302b.

The first non-volatile memory package 302a may include a plurality of non-volatile memory semiconductor chips 322, which are stacked on a second package substrate 310.

The plurality of non-volatile memory semiconductor chips 322 may be stacked on the second package substrate 310 and aligned in a vertical direction.

Each of the plurality of non-volatile memory semiconductor chips 322 may be electrically connected to the second package substrate 310 through a through electrode 332 and a second connection bump 342, which may penetrate each of the plurality of non-volatile memory semiconductor chips 322. The through electrode 332 may be a through-silicon via (TSV). The through electrode 332 may include an interconnection metal layer (not shown) and a barrier metal layer (not shown) surrounding the interconnection metal layer. The interconnection metal layer may include copper (Cu) or tungsten (W). For example, the interconnection metal layer may be formed of Cu, CuSn, CuMg, CuNi, CuZn, CuPd, CuAu, CuRe, CuW, W, or a W alloy, but the inventive concept is not limited thereto. For example, the interconnection metal layer may include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr) and have a stack structure of at least one thereof. The barrier metal layer may include at least one material selected from the group including W, WN, WC, Ti, TiN, Ta, TaN, Ru, Co, Mn, WN, Ni, or NiB and include a single layer or a multilayered structure. However, a material of the through electrode 332 is not limited to the above-described materials. The barrier metal layer and the interconnection metal layer may be formed by using a physical vapor deposition (PVD) process or a chemical vapor deposition (CVD) process, but the inventive concept is not limited thereto. A spacer insulating layer (not shown) may be interposed between the through electrode 332 and a semiconductor substrate forming each of the plurality of non-volatile memory semiconductor chips 322. The spacer insulating layer may prevent a semiconductor device formed in each of the non-volatile memory semiconductor chips 322 from directly contacting the through electrode 332. The spacer insulating layer may include an oxide layer, a nitride layer, a carbon layer, a polymer, or a combination thereof. In some embodiments, the spacer insulating layer may be formed by using a CVD process. The spacer insulating layer may include an ozone/tetra-ethyl ortho-silicate ($O_3$/TEOS)-based high-aspect-ratio-process (HARP) oxide layer formed by using a sub-atmospheric CVD (SACVD) process.

FIG. 12 illustrates the through electrode 332 that is completely formed through the non-volatile memory semiconductor chip 322, but the inventive concept is not limited thereto and the through electrode 332 may have any one of a via-first structure, a via-middle structure, or a via-last structure. For example, the through electrode 332 may include a portion vertically formed through the non-volatile memory semiconductor chip 322, an interconnection line, and an inter-metal via. Also, FIG. 12 illustrates a case in which the through electrode 332 is not formed in an uppermost non-volatile memory semiconductor chip 322 of the plurality of non-volatile memory semiconductor chips 322, but the inventive concept is not limited thereto. For example, the through electrode 332 may be formed in every each of the plurality of non-volatile memory semiconductor chips 322.

The cross-sectional view of the SSD 1000 shown in FIG. 12 may also be applied to the SSDs 1000a and 1000b shown in FIGS. 9 and 10.

Figure 13:
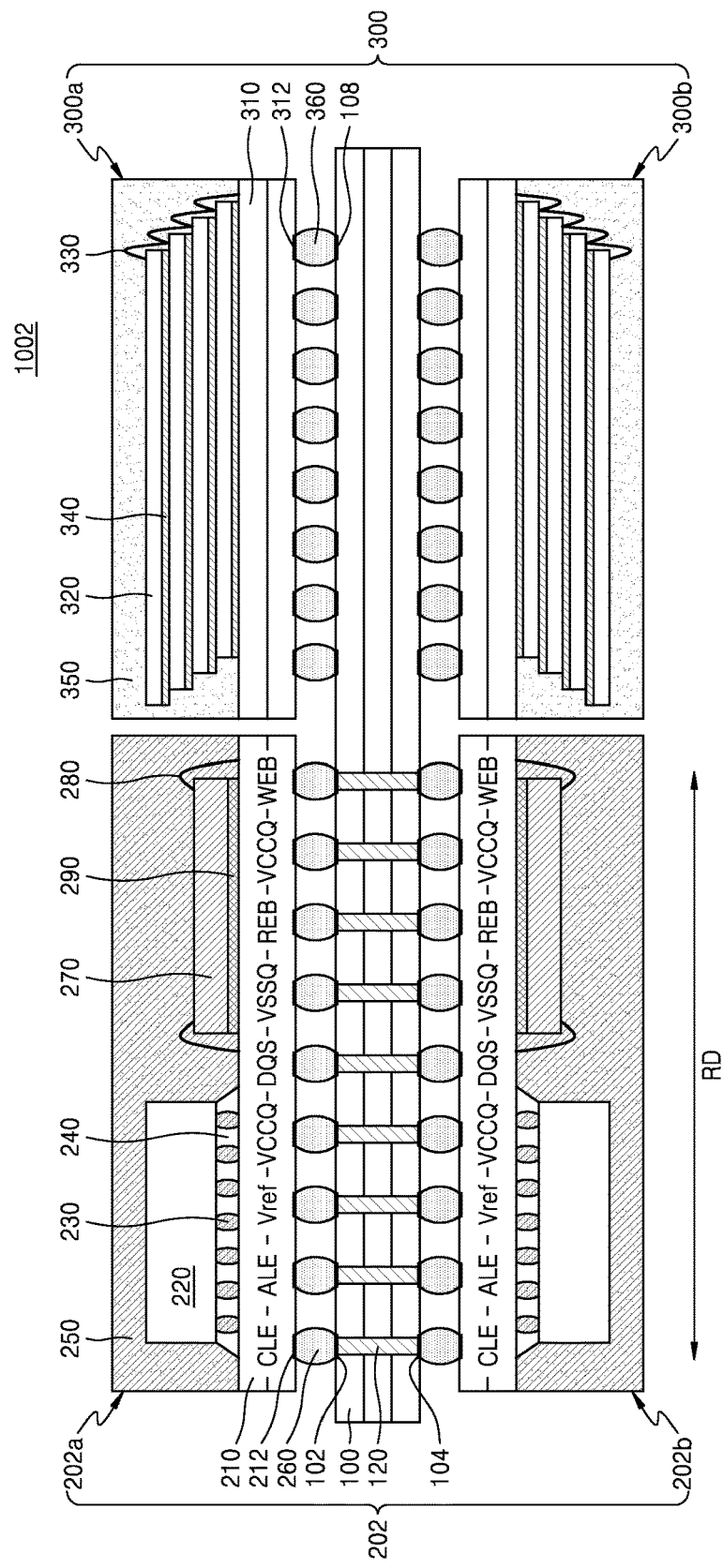
FIG. 13 is a cross-sectional view of main elements of an SSD according to an exemplary embodiment.

FIG. 13 is a cross-sectional view of main elements of an SSD 1002 according to an exemplary embodiment. The same descriptions as in FIG. 11 may be omitted from the descriptions of FIG. 13.

Referring to FIG. 13, the SSD 1002 may include a main PCB 100 and a semiconductor package 202 and a non-volatile memory package 300, which are mounted on the main PCB 100. The semiconductor package 202 may include a first controller package 202a and a second controller package 202b. The non-volatile memory package 300 may include a first non-volatile memory package 300a and a second non-volatile memory package 300b.

Unlike the first and second controller packages 200a and 200b shown in FIG. 11, each of the first and second controller packages 202a and 202b may further include a memory semiconductor chip 270 mounted on a first package substrate 210. The memory semiconductor chip 270 may be mounted on the first package substrate 210 and spaced apart from a controller chip 220. The memory semiconductor chip 270 may be a volatile memory semiconductor chip, for example, dynamic RAM (DRAM). The memory semiconductor chip 270 may provide a cache and scale an access time and data-transfer performance according to process performance of a system including the SSD 1002. The memory semiconductor chip 270 may be electrically connected to the first package substrate 210 via a second bonding wire 280. The memory semiconductor chip 270 may be adhered to the first package substrate 210 by a second DAF 290. When the controller chip 220 includes a cache function, the memory semiconductor chip 270 may be omitted as in the first and second controller packages 200a and 200b shown in FIG. 11.

The controller packages 202a and 202b of the SSD 1002 may be the same as the controller packages 200a and 200b of the SSD 1000 shown in FIG. 11 except that the controller packages 202a and 202b further include a memory semiconductor chip 270. Thus, detailed descriptions of the controller packages 202a and 201b of the SSD 1002 are omitted.

Although not shown, the SSD 1002 may include the non-volatile memory package 302 shown in FIG. 12 instead of the non-volatile memory package 300.

Figure 14:
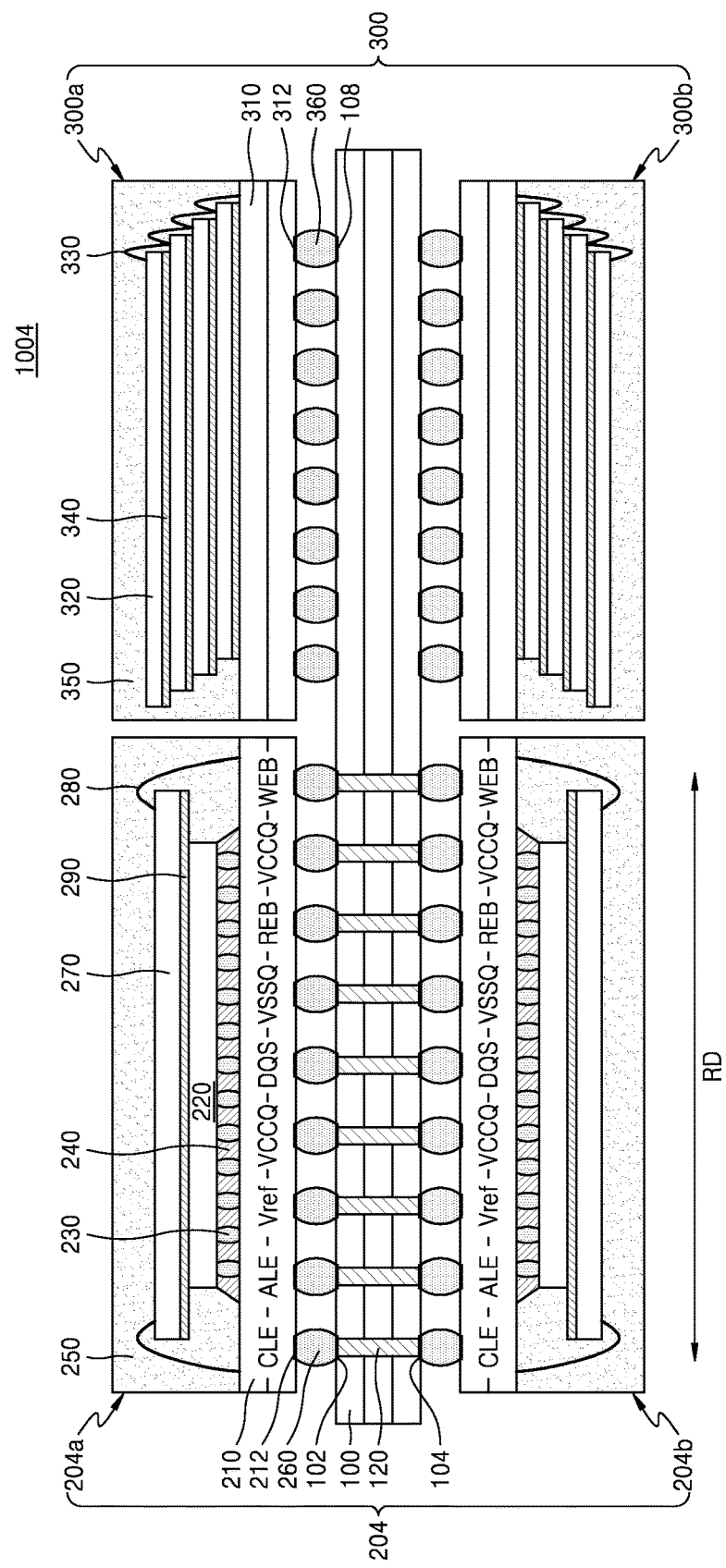
FIG. 14 is a cross-sectional view of main elements of an SSD according to an exemplary embodiment.

FIG. 14 is a cross-sectional view of main elements of an SSD 1004 according to an exemplary embodiment. The same descriptions as in FIGS. 11 and 13 may be omitted from the descriptions of FIG. 14.

Referring to FIG. 14, the SSD 1004 may include a main PCB 100 and a semiconductor package 204 and a non-volatile memory package 300 mounted on the main PCB 100. The semiconductor package 204 may include a first controller package 204a and a second controller package 204b. The non-volatile memory package 300 may include a first non-volatile memory package 300a and a second non-volatile memory package 300b.

Unlike the first and second controller packages 200a and 200b shown in FIG. 11, each of the first and second controller packages 204a and 204b may further include a memory semiconductor chip 270 stacked on a controller chip 220 mounted on a first package substrate 210.

The controller packages 204a and 204b of the SSD 1004 may be the same as the controller packages 200a and 200b of the SSD 1000 shown in FIG. 11 except that the controller packages 204a and 204b further include a memory semiconductor chip 270. Thus, detailed descriptions of the controller packages 204a and 204b of the SSD 1004 are omitted.

Although not shown, the SSD 1004 may include the non-volatile memory package 302 shown in FIG. 12 instead of the non-volatile memory package 300.

Figure 15:
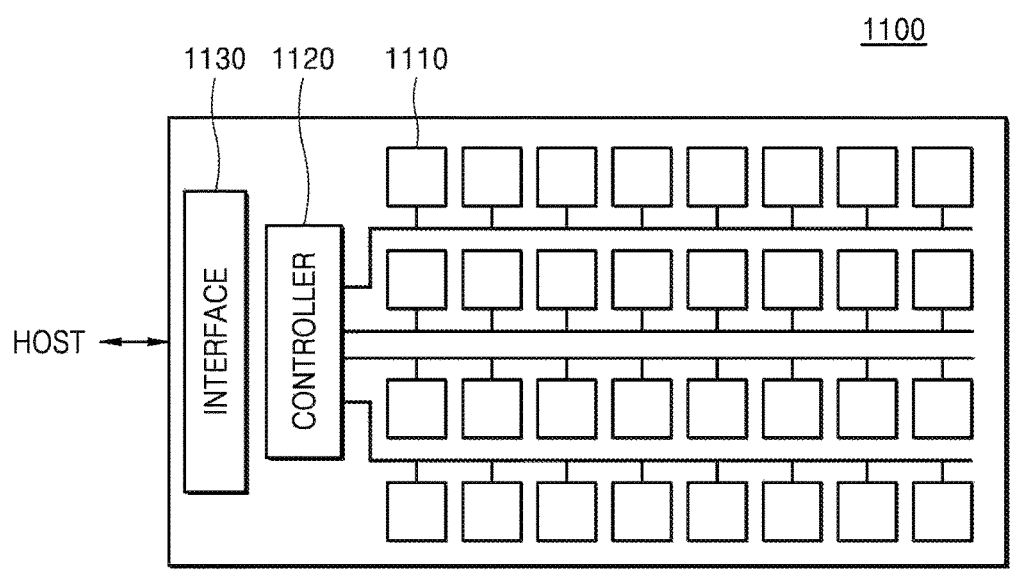
FIG. 15 is a block diagram illustrating a configuration of an SSD according to exemplary embodiments.

FIG. 15 is a construction diagram of an SSD 1100 according to exemplary embodiments.

Referring to FIG. 15, the SSD 1100 may include a plurality of non-volatile memories 1110 and a controller 1120. The non-volatile memory 1110 may store data and have non-volatile characteristics so as to retain stored data even if power supply is interrupted. The SSD 1100 may be any one of the SSDs 1000, 1000a, 1000b, 1002, 1004 described with reference to FIGS. 1 to 14.

The controller 1120 may read data stored in the non-volatile memory 1110 or store data in the non-volatile memory 1110 in response to read/write requests of a host HOST. The interface 1130 may transmit a command and an address signal to the host HOST or receive the command and the address signal from the host HOST. Also, the interface 1130 may transmit the command and the address signal to the non-volatile memory 1110 again or receive the command and the address signal from the non-volatile memory 1110 via the controller 1120.

The SSD 1100 may further include active devices or passive devices, such as a resistor, a capacitor, an inductor, a switch, a temperature sensor, a DC-DC converter, a quartz for generating clocks, or a voltage regulator.

Figure 16:
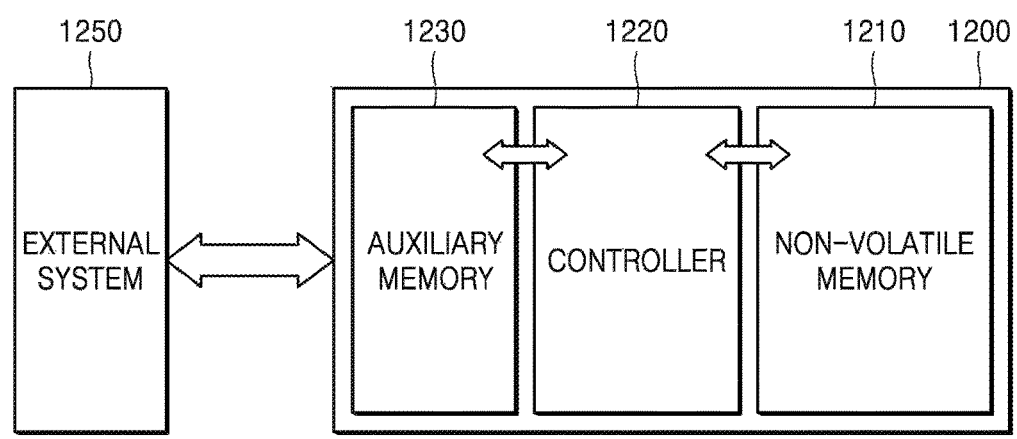
FIG. 16 is a schematic diagram showing relationships between an SSD and an external system according to exemplary embodiments.

FIG. 16 is a schematic diagram showing connections between an SSD 1200 and an external system 1250 according to exemplary embodiments.

Referring to FIG. 16, the SSD 1200 may include a non-volatile memory 1210, a controller 1220, and an auxiliary memory 1230. Data input by the external system 1250 may be stored in the non-volatile memory 1210 via the auxiliary memory 1230 and the controller 1220. Also, the controller 1220 may read data from the non-volatile memory 1210 via the auxiliary memory 1230 and transmit the data to the external system 1250.

The SSD 1200 may be any one of the SSDs 1000, 1000a, 1000b, 1002, and 1004 described with reference to FIGS. 1 to 14.

Figure 17:
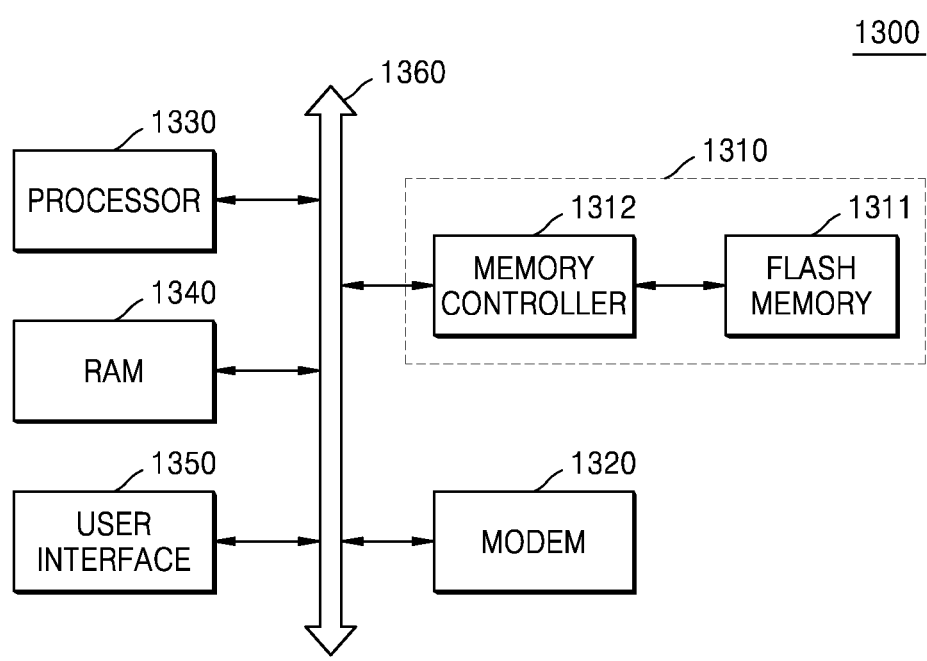
FIG. 17 is a block diagram of a data storage system including an SSD according to exemplary embodiments.

FIG. 17 is a block diagram of a data storage system 1300 including an SSD according to exemplary embodiments.

Referring to FIG. 17, the data storage system 1300 may include a processor 1330 (e.g., a central processing unit (CPU)), a random access memory (RAM) 1340, a user interface 1350, and a modem 1320, which may communicate with one another via a common bus 1360. The processor 1330, the RAM 1340, the user interface 1350, and the modem 1320 may transmit signals to the storage device 1310 through the common bus 1360 and receive the signals from the storage device 1310 through the common bus 1360. The storage device 1310 may include a flash memory 1311 and a memory controller 1312. The flash memory 1311 may store data and have non-volatile characteristics so as to retain stored data even if power supply is interrupted. The storage device 1310 may be any one of the SSDs 1000, 1000a, 1000b, 1002, and 1004 described with reference to FIGS. 1 to 14.

Figure 18:
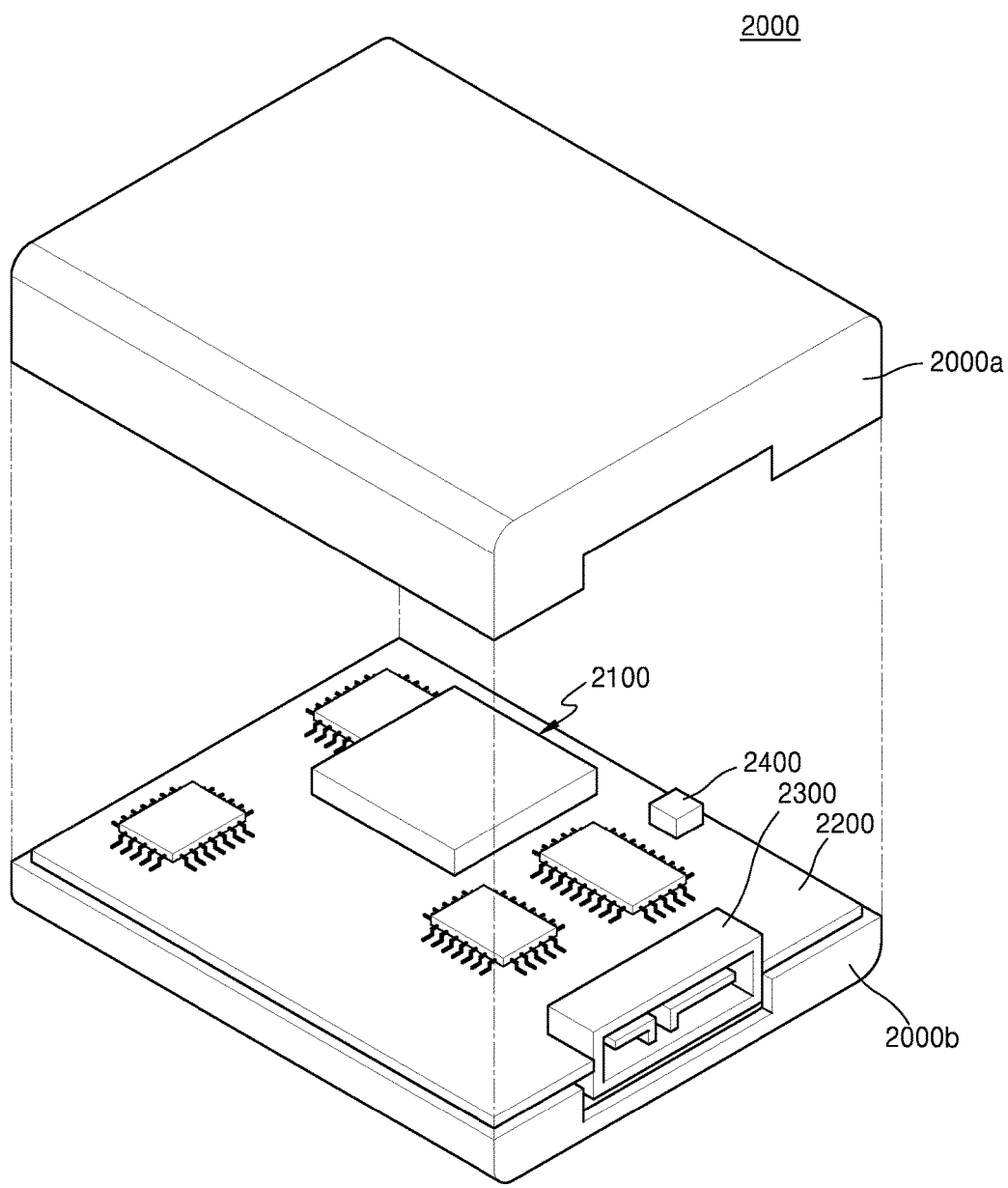
FIG. 18 is an exploded perspective view of a data storage system including an SSD according to exemplary embodiments.

FIG. 18 is an exploded perspective view of a data storage system 2000 including an SSD according to exemplary embodiments.

Referring to FIG. 18, the data storage system 2000 may include a main board 2200 and an SSD 2100 mounted on the main board 2200. The SSD 2100 may be electrically connected to an I/O terminal 2300 through an interconnection (not shown) formed on a main board 2200. The SSD 2100 may include a lower package and upper packages (not shown) mounted on the lower package. The SSD 2100 may be any one of the SSDs 1000, 1000a, 1000b, 1002, and 1004 described with reference to FIGS. 1 to 14.

In addition, the data storage system 2000 may further include a power terminal 2400 configured to supply power to the main board 2200. The main board 2200 may be provided in a case 2000a and 2000b.

The I/O terminal 2300 may form an interface between the data storage system 2000 and an external apparatus. The I/O terminal 2300 may include a program capable of exchanging signals with the external apparatus by using a standard protocol, such as PCIe, SAS, or SATA. Here, the SATA may include not only so-called SATA-1 but also all SATA-based standards, such as SATA-2, SATA-3, and external SATA (e-SATA).

The data storage system 2000 may be, for example, a portable data storage system or a network attached storage (NAS) device. Here, the NAS device may be a device capable of inputting and outputting data via a local area network (LAN) (e.g., Ethernet or transmission control protocol/Internet protocol (TCP/IP)) or a wide area network (WAN). In this case, the I/O terminal 2300 may be a terminal capable of accommodating an I/O cable based on the standard of the network.

Figure 19:
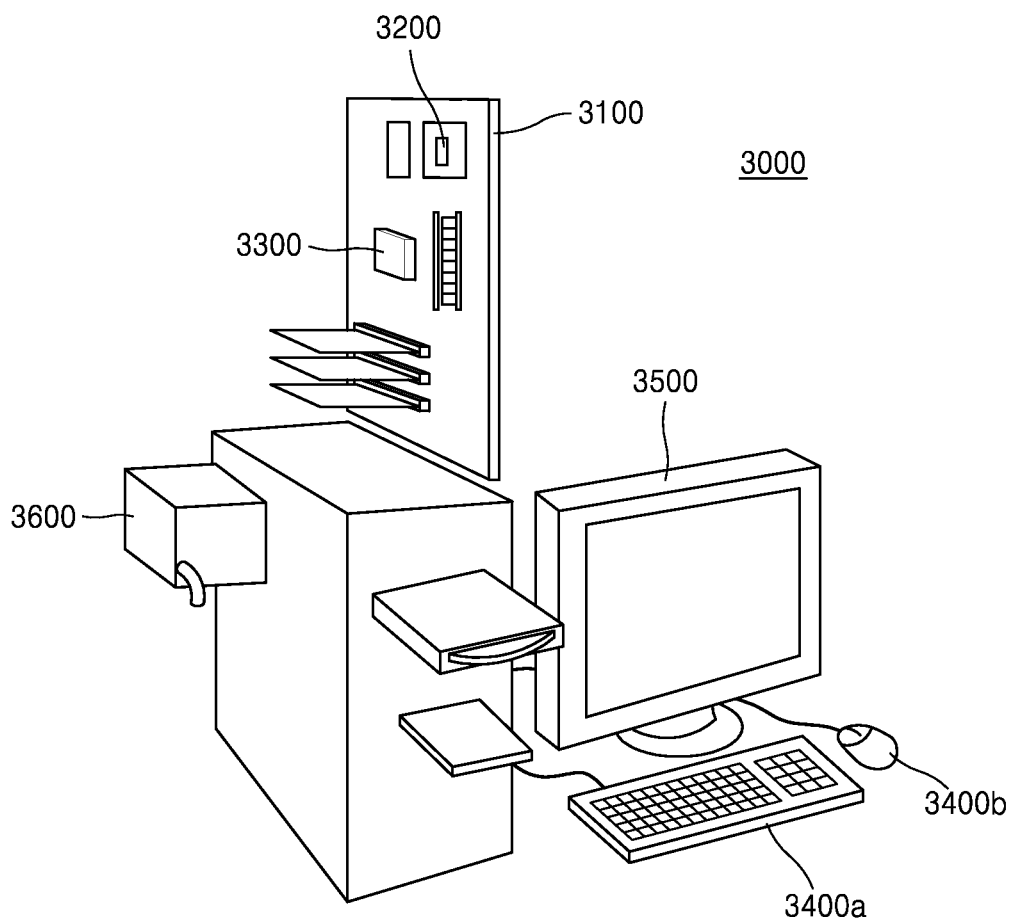
FIG. 19 is a conceptual diagram of a system including an SSD according to exemplary embodiments.

FIG. 19 is a schematic diagram of a system 3000 adopting an SSD according to exemplary embodiments.

Referring to FIG. 19, the system 3000 may include a main board 3100 and a central processing unit (CPU) 3200, an SSD 3300, input devices 3400a and 3400b, and an output device 3500, which are mounted on the main board 3100. The SSD 3300 may be any one of the SSDs 1000, 1000a, 1000b, 1002, and 1004 described with reference to FIGS. 1 to 14.

The input devices 3400a and 3400b may be a keyboard, a mouse, and a touch screen, but the inventive concept is not limited thereto. The input devices 3400a and 3400b may be devices capable of inputting data to the CPU 3200. The output device 3500 may be a monitor or a printer, but the inventive concept is not limited thereto. The output device 3500 may be a device capable of outputting data from the CPU 3200. The input devices 3400a and 3400b and the output device 3500 may be merged into a single device.

The SSD 3300 may be mounted on the main board 3100. The SSD 3300 may communicate with the CPU 3200 by using a standard protocol through a conductive pattern formed on the main board 3100.

The system 3000 may include a power supply device 3600 and supply required power to the main board 3100.

The system 3000 may be a desktop personal computer (PC), a laptop PC, a smartphone, a tablet laptop computer, a portable multimedia player (PMP), a navigation system, or a flat panel display (FPD) television.

Figure 20:
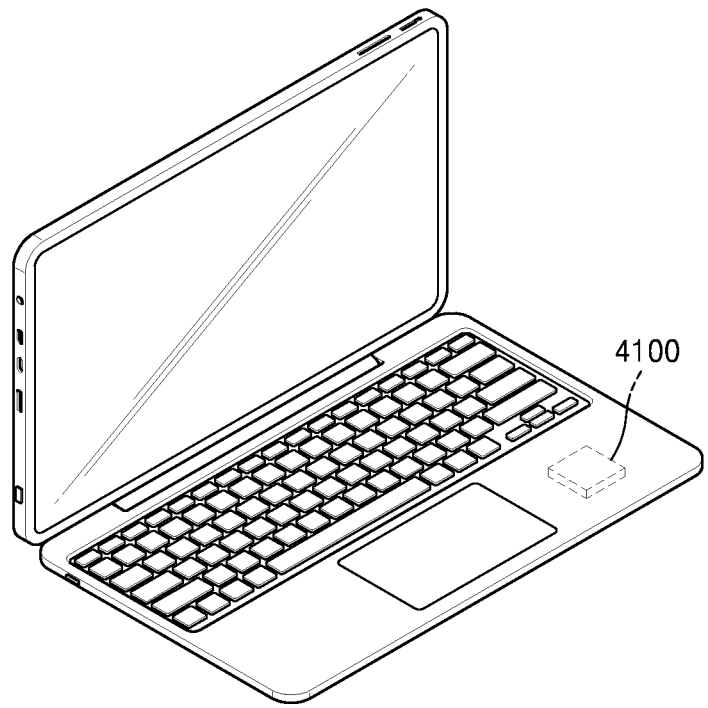
FIGS. 20 and 21 are perspective views of examples of SSDs according to exemplary embodiments and applied to multimedia devices.
Figure 21:
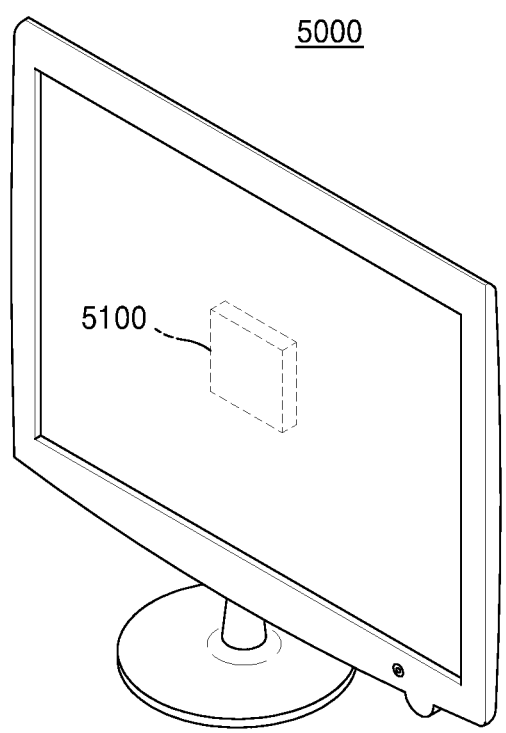

FIGS. 20 and 21 are perspective views of examples of applying SSDs according to exemplary embodiments to multimedia devices.

Referring to FIGS. 20 and 21, SSDs according to exemplary embodiments may be applied to various multimedia devices. For instance, an SSD 4100 according to an exemplary embodiment may be applied to a laptop computer 4000 as shown in FIG. 20. Also, an SSD 5100 according to an exemplary embodiment may be applied to a television (TV) (or smart TV) 5000 as shown in FIG. 21.

The laptop computer 4000 and the TV (or smart TV) 5000 may have high reliability and be downscaled and highly efficient because of a highly reliable SSD having a large capacity per volume and a small size per capacity may be applied to the laptop computer 4000 and the TV (or smart TV) 5000.

While the inventive concept has been particularly shown and described with reference to exemplary embodiments thereof, it will be understood that various changes in form and details may be made therein without departing from the spirit and scope of the following claims.

What is claimed is:

1. A solid-state drive (SSD) comprising:
a main printed circuit board (PCB); and
a first semiconductor package and a second semiconductor package respectively mounted on a top surface and a bottom surface of the main PCB;
wherein each of the first and second semiconductor packages has a surface on which connection pads corresponding to cells of a package ball map are disposed, the cells of the package ball map are arranged in a plurality of rows and a plurality of columns, and respective signals correspond to each of the cells of the package ball map;
wherein the package ball map is arranged wherein
first signals correspond to at least some of cells from among the cells of the package ball map included in a reference column selected from among the plurality of columns, and
at least one pair of second signals respectively correspond to cells from among the cells of the package ball map that are symmetrical to each other with respect to the reference column,
wherein the pair of second signals are swappable signals, and the first signals are not swappable, and
the package ball map is further arranged wherein a mode selection signal corresponds to one of cells from among the cells of the package ball map included in a column from among the plurality of columns other than the reference column, and the mode selection signal swaps the pair of second signals with each other.

2. The SSD of claim 1, wherein the first and second semiconductor packages are respectively mounted on the top surface and the bottom surface of the main PCB, and first connection pads from among the connection pads respectively corresponding to the first signals are arranged in a first direction.

3. The SSD of claim 2, wherein the first connection pads are arranged in the first direction, and second connection pads from among the connection pads corresponding to the at least one pair of second signals respectively correspond to surfaces of the first and second semiconductor packages that are spaced apart from the first connection pads arranged in the first direction.

4. The SSD of claim 2, wherein the first semiconductor package comprises a third connection pad corresponding to the mode selection signal and the second semiconductor package comprises another third connection pad corresponding to the mode selection signal; and the third connection pads correspond to surfaces of each of the first and second semiconductor packages spaced apart from a straight line extending along the first connection pads.

5. The SSD of claim 4, wherein the main PCB comprises a first bottom pad, which corresponds to and is electrically connected to the another third connection pad of the second semiconductor package, and the first bottom pad is electrically connected to one of a power signal and a ground signal.

6. The SSD of claim 4, wherein the third connection pad of the first semiconductor package is electrically insulated from the main PCB.

7. The SSD of claim 4, wherein the main PCB comprises a first top pad and a first bottom pad, which respectively correspond to and are electrically connected to the third connection pad of the first semiconductor package and the another third connection pad of the second semiconductor package; and a power signal is electrically connected to one of the first top pad and the first bottom pad, and a ground signal is electrically connected to an other of the first top pad and the first bottom pad.

8. The SSD of claim 1, wherein the at least one pair of second signals are data signals.

9. The SSD of claim 1, wherein the first and second semiconductor packages provide a one-channel non-volatile memory interface.

10. A solid-state drive (SSD) comprising:
a main printed circuit board (PCB);
a first controller package and a first non-volatile memory package mounted on a top surface of the main PCB; and
a second controller package and a second non-volatile memory package mounted on a bottom surface of the main PCB;
wherein each of the first and second controller packages has a surface on which connection pads, which face each other across the main PCB and correspond to cells of a package ball map, are disposed, and the cells of the package ball map are arranged in a plurality of rows and a plurality of columns, and respective signals correspond to each of the cells of the package ball map;
wherein the package ball map is arranged wherein
first signals correspond to at least some of cells from among the cells of the package ball map included in a reference column from among the plurality of columns, wherein the first signals are not swappable; and
at least one pair of second signals respectively correspond to cells from among the cells of the package ball map that are symmetrical to each other with respect to the reference column, wherein the second signals in the at least one pair of second signals are swappable with each other.

11. The SSD of claim 10, wherein the first and second controller packages are respectively mounted on the top surface and the bottom surface of the main PCB and include, first connection pads from among the connection pads respectively corresponding to the first signals arranged in a first direction; and the first and second non-volatile memory packages are spaced apart from the first controller package and the second controller package in the first direction and respectively mounted on the top surface and the bottom surface of the main PCB.

12. The SSD of claim 11, wherein the first connection pads of the first semiconductor package face the first connection pads of the second semiconductor package across the main PCB.

13. The SSD of claim 11, wherein second connection pads from among the connection pads correspond to the second signals;
a pair of second signals from among the at least one pair of second signals of one of the first and second controller packages are swappable with each other; and
among the connection pads of each of the first and second controller packages, a same second signal from among the second signals is provided to second connection pads which face each other across the main PCB.

14. The SSD of claim 10, wherein each of the first and second non-volatile memory packages comprises a plurality of stacked non-volatile memory semiconductor chips.

15. A solid-state drive (SSD) comprising:
a main printed circuit board (PCB) having opposing first and second surfaces;
a first semiconductor package mounted on the first surface of the main PCB; and
a second semiconductor package mounted on the second surface of the main PCB,
wherein each of the first and second semiconductor packages has a surface with connection pads thereon which correspond to cells of a package ball map, the cells of the package ball map are arranged in a plurality of rows and a plurality of columns, and respective signals correspond to each of the cells of the package ball map,
wherein the package ball map comprises a reference column from among the plurality of columns, wherein first signals correspond to at least some cells from among the cells of the package ball map included in the reference column, and at least one pair of second signals respectively correspond to cells from among the cells of the package ball map that are opposite to each other with respect to the reference column,
wherein the at least one pair of second signals are swappable signals responsive to a mode selection signal that swaps the at least one pair of second signals with each other,
wherein the first and second semiconductor packages are respectively mounted on the first and second surfaces of the main PCB, and first connection pads from among the connection pads respectively corresponding to the first signals are arranged in a first direction, and
wherein the package ball map is further arranged wherein the mode selection signal corresponds to a cell from among the cells of the package ball map included in a column from among the plurality of columns other than the reference column.

* * * * *